US012562688B2

(12) United States Patent
Khlat

(10) Patent No.: US 12,562,688 B2
(45) Date of Patent: Feb. 24, 2026

(54) POWER MANAGEMENT CIRCUIT OPERABLE WITH MULTIPLE SUPPLY VOLTAGES

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 387 days.

(21) Appl. No.: 18/252,155

(22) PCT Filed: Sep. 27, 2021

(86) PCT No.: PCT/US2021/052151
§ 371 (c)(1),
(2) Date: May 8, 2023

(87) PCT Pub. No.: WO2022/103496
PCT Pub. Date: May 19, 2022

(65) Prior Publication Data
US 2024/0014782 A1      Jan. 11, 2024

Related U.S. Application Data

(60) Provisional application No. 63/114,193, filed on Nov. 16, 2020.

(51) Int. Cl.
 *H03F 1/30*      (2006.01)
 *H03F 1/02*      (2006.01)
 *H03F 3/24*      (2006.01)
(52) U.S. Cl.
 CPC ........... *H03F 1/0233* (2013.01); *H03F 3/245* (2013.01); *H03F 2200/105* (2013.01); *H03F 2200/451* (2013.01)
(58) Field of Classification Search
 CPC ...................................................... H03F 1/30
 (Continued)

(56) References Cited

U.S. PATENT DOCUMENTS

| | | | |
|---|---|---|---|
| 4,646,035 A | 2/1987 | Chapelle |
| 5,266,936 A | 11/1993 | Saitoh |

(Continued)

FOREIGN PATENT DOCUMENTS

| | | |
|---|---|---|
| CN | 103444076 A | 12/2013 |
| CN | 103916093 A | 7/2014 |

(Continued)

OTHER PUBLICATIONS

Corrected Notice of Allowability and Response to Rule 312 Communication for U.S. Appl. No. 18/039,805, mailed Nov. 21, 2024, 5 pages.

(Continued)

*Primary Examiner* — Henry Choe
(74) *Attorney, Agent, or Firm* — Withrow & Terranova, P.L.L.C.

(57)      ABSTRACT

A power management circuit operable with multiple supply voltages is disclosed. In embodiments disclosed herein, the power management circuit includes a supply voltage circuit (s) capable of simultaneously generating multiple supply voltages at different voltage levels. The power management circuit also includes multiple envelope tracking (ET) voltage circuits each configured to generate a respective one of multiple ET voltages based on the multiple supply voltages. In this regard, each ET voltage circuit can dynamically use different supply voltages from time to time to generate the respective ET voltage. As a result, it is possible to prevent distortion (e.g., amplitude clipping) in any of the ET voltages, especially when large peak-to-average ratio (PAR) is expected in the ET voltages.

16 Claims, 6 Drawing Sheets

(58) Field of Classification Search
USPC ........................................ 330/297, 296, 285
See application file for complete search history.

(56) References Cited

U.S. PATENT DOCUMENTS

| | | | |
|---|---|---|---|
| 5,510,753 | A | 4/1996 | French |
| 5,838,732 | A | 11/1998 | Carney |
| 6,107,862 | A | 8/2000 | Mukainakano et al. |
| 6,141,377 | A | 10/2000 | Sharper et al. |
| 6,141,541 | A | 10/2000 | Midya et al. |
| 6,411,531 | B1 | 6/2002 | Nork et al. |
| 6,529,716 | B1 | 3/2003 | Eidson et al. |
| 6,788,151 | B2 | 9/2004 | Shvarts et al. |
| 6,985,033 | B1 | 1/2006 | Shirali et al. |
| 7,043,213 | B2 | 5/2006 | Robinson et al. |
| 7,193,467 | B2 | 3/2007 | Garlepp et al. |
| 7,471,155 | B1 | 12/2008 | Levesque |
| 7,570,931 | B2 | 8/2009 | McCallister et al. |
| 7,675,365 | B2 | 3/2010 | Lee et al. |
| 7,859,338 | B2 | 12/2010 | Bajdechi et al. |
| 7,994,862 | B1 | 8/2011 | Pukhovski |
| 8,019,289 | B2 | 9/2011 | Gorbachov |
| 8,290,453 | B2 | 10/2012 | Yoshihara |
| 8,385,859 | B2 | 2/2013 | Hamano |
| 8,461,928 | B2 | 6/2013 | Yahav et al. |
| 8,476,976 | B2 | 7/2013 | Wimpenny |
| 8,493,141 | B2 | 7/2013 | Khlat et al. |
| 8,519,788 | B2 | 8/2013 | Khlat |
| 8,588,713 | B2 | 11/2013 | Khlat |
| 8,598,950 | B2 | 12/2013 | Khesbak |
| 8,600,321 | B2 | 12/2013 | Nambu et al. |
| 8,611,402 | B2 | 12/2013 | Chiron |
| 8,665,016 | B2 | 3/2014 | Chowdhury et al. |
| 8,665,931 | B2 | 3/2014 | Afsahi et al. |
| 8,704,594 | B2 | 4/2014 | Mulawski |
| 8,718,188 | B2 | 5/2014 | Balteanu et al. |
| 8,723,492 | B2 | 5/2014 | Korzeniowski |
| 8,725,218 | B2 | 5/2014 | Brown et al. |
| 8,774,065 | B2 | 7/2014 | Khlat et al. |
| 8,803,603 | B2 | 8/2014 | Wimpenny |
| 8,816,272 | B1 | 8/2014 | Brown et al. |
| 8,816,768 | B2 | 8/2014 | Tseng et al. |
| 8,818,305 | B1 | 8/2014 | Schwent et al. |
| 8,854,129 | B2 | 10/2014 | Wilson |
| 8,879,665 | B2 | 11/2014 | Xia et al. |
| 8,913,690 | B2 | 12/2014 | Onishi |
| 8,921,774 | B1 | 12/2014 | Brown et al. |
| 8,942,651 | B2 | 1/2015 | Jones |
| 8,947,161 | B2 | 2/2015 | Khlat et al. |
| 8,989,682 | B2 | 3/2015 | Ripley et al. |
| 9,002,303 | B2 | 4/2015 | Brobston |
| 9,018,921 | B2 | 4/2015 | Gurlahosur |
| 9,020,451 | B2 | 4/2015 | Khlat |
| 9,020,453 | B2 | 4/2015 | Briffa et al. |
| 9,041,364 | B2 | 5/2015 | Khlat |
| 9,041,365 | B2 | 5/2015 | Kay et al. |
| 9,055,529 | B2 | 6/2015 | Shih |
| 9,065,509 | B1 | 6/2015 | Yan et al. |
| 9,069,365 | B2 | 6/2015 | Brown et al. |
| 9,098,099 | B2 | 8/2015 | Park et al. |
| 9,166,538 | B2 | 10/2015 | Hong et al. |
| 9,166,830 | B2 | 10/2015 | Camuffo et al. |
| 9,167,514 | B2 | 10/2015 | Dakshinamurthy et al. |
| 9,172,303 | B2 | 10/2015 | Vasadi et al. |
| 9,197,162 | B2 | 11/2015 | Chiron et al. |
| 9,197,182 | B2 | 11/2015 | Baxter et al. |
| 9,197,256 | B2 | 11/2015 | Khlat |
| 9,225,362 | B2 | 12/2015 | Drogi et al. |
| 9,246,460 | B2 | 1/2016 | Khlat et al. |
| 9,247,496 | B2 | 1/2016 | Khlat |
| 9,263,997 | B2 | 2/2016 | Vinayak |
| 9,270,230 | B2 | 2/2016 | Henshaw et al. |
| 9,270,239 | B2 | 2/2016 | Drogi et al. |
| 9,271,236 | B2 | 2/2016 | Drogi |
| 9,277,501 | B2 | 3/2016 | Lorenz et al. |
| 9,280,163 | B2 | 3/2016 | Kay et al. |
| 9,287,829 | B2 | 3/2016 | Nobbe et al. |
| 9,288,098 | B2 | 3/2016 | Yan et al. |
| 9,294,043 | B2 | 3/2016 | Ripley et al. |
| 9,298,198 | B2 | 3/2016 | Kay et al. |
| 9,344,304 | B1 | 5/2016 | Cohen |
| 9,356,512 | B2 | 5/2016 | Chowdhury et al. |
| 9,356,760 | B2 | 5/2016 | Larsson et al. |
| 9,362,868 | B2 | 6/2016 | Al-Qaq et al. |
| 9,374,005 | B2 | 6/2016 | Rozek et al. |
| 9,377,797 | B2 | 6/2016 | Kay et al. |
| 9,379,667 | B2 | 6/2016 | Khlat et al. |
| 9,438,172 | B2 | 9/2016 | Cohen |
| 9,445,371 | B2 | 9/2016 | Khesbak et al. |
| 9,491,314 | B2 | 11/2016 | Wimpenny |
| 9,515,621 | B2 | 12/2016 | Hietala et al. |
| 9,515,622 | B2 | 12/2016 | Nentwig et al. |
| 9,516,693 | B2 | 12/2016 | Khlat et al. |
| 9,520,907 | B2 | 12/2016 | Peng et al. |
| 9,560,595 | B2 | 1/2017 | Dakshinamurthy et al. |
| 9,571,152 | B2 | 2/2017 | Ripley et al. |
| 9,584,071 | B2 | 2/2017 | Khlat |
| 9,595,869 | B2 | 3/2017 | Lerdworatawee |
| 9,595,981 | B2 | 3/2017 | Khlat |
| 9,596,110 | B2 | 3/2017 | Jiang et al. |
| 9,614,476 | B2 | 4/2017 | Khlat |
| 9,614,477 | B1 | 4/2017 | Rozenblit et al. |
| 9,634,666 | B2 | 4/2017 | Krug |
| 9,641,206 | B2 | 5/2017 | Pratt et al. |
| 9,671,801 | B2 | 6/2017 | Bhattad et al. |
| 9,705,451 | B2 | 7/2017 | Takenaka et al. |
| 9,743,357 | B2 | 8/2017 | Tabe |
| 9,748,845 | B1 | 8/2017 | Kotikalapoodi |
| 9,768,731 | B2 | 9/2017 | Perreault et al. |
| 9,806,676 | B2 | 10/2017 | Balteanu et al. |
| 9,831,834 | B2 | 11/2017 | Balteanu et al. |
| 9,831,934 | B2 | 11/2017 | Kotecha et al. |
| 9,837,962 | B2 | 12/2017 | Mathe et al. |
| 9,843,294 | B2 | 12/2017 | Khlat |
| 9,859,845 | B2 | 1/2018 | Sarbishaei et al. |
| 9,900,204 | B2 | 2/2018 | Levesque et al. |
| 9,912,296 | B1 | 3/2018 | Cheng et al. |
| 9,912,297 | B2 | 3/2018 | Khlat |
| 9,912,301 | B2 | 3/2018 | Xue et al. |
| 9,923,520 | B1 | 3/2018 | Abdelfattah et al. |
| 9,941,844 | B2 | 4/2018 | Khlat |
| 9,948,240 | B2 | 4/2018 | Khlat et al. |
| 9,954,436 | B2 | 4/2018 | Khlat |
| 9,960,737 | B1 | 5/2018 | Kovac |
| 9,974,050 | B2 | 5/2018 | Wiser et al. |
| 9,991,851 | B1 | 6/2018 | Dinur et al. |
| 9,991,856 | B2 | 6/2018 | Khesbak et al. |
| 9,991,913 | B1 | 6/2018 | Dinur et al. |
| 10,003,303 | B2 | 6/2018 | Afsahi et al. |
| 10,003,416 | B1 | 6/2018 | Lloyd |
| 10,069,470 | B2 | 9/2018 | Khlat et al. |
| 10,084,376 | B2 | 9/2018 | Lofthouse |
| 10,090,808 | B1 | 10/2018 | Henzler et al. |
| 10,090,809 | B1 | 10/2018 | Khlat |
| 10,097,145 | B1 | 10/2018 | Khlat et al. |
| 10,097,387 | B1 | 10/2018 | Wiser et al. |
| 10,103,693 | B2 | 10/2018 | Zhu et al. |
| 10,103,926 | B1 | 10/2018 | Khlat |
| 10,110,169 | B2 | 10/2018 | Khesbak et al. |
| 10,116,470 | B2 | 10/2018 | Gu et al. |
| 10,141,891 | B2 | 11/2018 | Gomez et al. |
| 10,158,328 | B2 | 12/2018 | Nobbe et al. |
| 10,158,329 | B1 | 12/2018 | Khla |
| 10,158,330 | B1 | 12/2018 | Khlat |
| 10,170,989 | B2 | 1/2019 | Balteanu et al. |
| 10,171,037 | B2 | 1/2019 | Khlat |
| 10,171,038 | B1 | 1/2019 | Chen et al. |
| 10,181,826 | B2 | 1/2019 | Khlat et al. |
| 10,204,775 | B2 | 2/2019 | Brown et al. |
| 10,284,412 | B2 | 5/2019 | Khlat et al. |
| 10,291,126 | B1 | 5/2019 | Wei et al. |
| 10,291,181 | B2 | 5/2019 | Kim et al. |
| 10,305,429 | B2 | 5/2019 | Choo et al. |
| 10,326,408 | B2 | 6/2019 | Khlat et al. |

(56) References Cited

U.S. PATENT DOCUMENTS

| 10,355,646 | B2 | 7/2019 | Lee et al. |
| 10,355,678 | B2 | 7/2019 | Ye et al. |
| 10,361,660 | B2 | 7/2019 | Khlat |
| 10,361,744 | B1 | 7/2019 | Khlat |
| 10,381,983 | B2 | 8/2019 | Balteanu et al. |
| 10,382,071 | B2 | 8/2019 | Rozek et al. |
| 10,382,147 | B2 | 8/2019 | Ripley et al. |
| 10,396,716 | B2 | 8/2019 | Afsahi et al. |
| 10,419,255 | B2 | 9/2019 | Wiser et al. |
| 10,432,145 | B2 | 10/2019 | Khlat |
| 10,439,557 | B2 | 10/2019 | Khlat et al. |
| 10,439,789 | B2 | 10/2019 | Brunel et al. |
| 10,454,428 | B2 | 10/2019 | Khesbak et al. |
| 10,476,437 | B2 | 11/2019 | Nag et al. |
| 10,622,900 | B1 | 4/2020 | Wei et al. |
| 10,680,556 | B2 | 6/2020 | Khlat |
| 10,756,675 | B2 | 8/2020 | Leipold et al. |
| 10,862,431 | B1 | 12/2020 | Khlat |
| 10,873,260 | B2 | 12/2020 | Yan et al. |
| 10,879,804 | B2 | 12/2020 | Kim et al. |
| 11,050,433 | B1 | 6/2021 | Melanson et al. |
| 11,088,660 | B2 | 8/2021 | Lin et al. |
| 11,121,684 | B2 | 9/2021 | Henzler et al. |
| 11,128,261 | B2 | 9/2021 | Ranta et al. |
| 11,139,780 | B2 | 10/2021 | Khlat |
| 11,152,976 | B2 | 10/2021 | Cho et al. |
| 11,183,756 | B1 | 11/2021 | Pond et al. |
| 11,387,789 | B2 | 7/2022 | Khlat et al. |
| 11,424,719 | B2 | 8/2022 | Khlat |
| 11,558,016 | B2 | 1/2023 | Khlat |
| 11,569,783 | B2 | 1/2023 | Nomiyama et al. |
| 11,637,531 | B1 | 4/2023 | Perreault et al. |
| 11,848,564 | B2 | 12/2023 | Jung et al. |
| 2002/0021110 | A1 | 2/2002 | Nakagawa et al. |
| 2002/0157069 | A1 | 10/2002 | Ogawa et al. |
| 2002/0167827 | A1 | 11/2002 | Umeda et al. |
| 2003/0107428 | A1 | 6/2003 | Khouri et al. |
| 2004/0100323 | A1 | 5/2004 | Khanifer et al. |
| 2004/0201281 | A1 | 10/2004 | Ma et al. |
| 2004/0266366 | A1 | 12/2004 | Robinson et al. |
| 2005/0088160 | A1 | 4/2005 | Tanaka et al. |
| 2005/0090209 | A1 | 4/2005 | Behzad |
| 2005/0227646 | A1 | 10/2005 | Yamazaki et al. |
| 2005/0232385 | A1 | 10/2005 | Yoshikawa et al. |
| 2006/0028271 | A1 | 2/2006 | Wilson |
| 2006/0055458 | A1 | 3/2006 | Shiikuma et al. |
| 2006/0240786 | A1 | 10/2006 | Liu |
| 2007/0036212 | A1 | 2/2007 | Leung et al. |
| 2007/0052474 | A1 | 3/2007 | Saito |
| 2007/0053217 | A1 | 3/2007 | Darroman |
| 2007/0258602 | A1 | 11/2007 | Vepsalainen et al. |
| 2007/0290748 | A1 | 12/2007 | Woo et al. |
| 2008/0116960 | A1 | 5/2008 | Nakamura |
| 2008/0231115 | A1 | 9/2008 | Cho et al. |
| 2008/0231358 | A1 | 9/2008 | Maemura |
| 2008/0239772 | A1 | 10/2008 | Oraw et al. |
| 2009/0016085 | A1 | 1/2009 | Rader et al. |
| 2009/0045872 | A1 | 2/2009 | Kenington |
| 2009/0128236 | A1 | 5/2009 | Wilson |
| 2009/0191826 | A1 | 7/2009 | Takinami et al. |
| 2009/0253389 | A1 | 10/2009 | Ma et al. |
| 2010/0019052 | A1 | 1/2010 | Yip |
| 2010/0039321 | A1 | 2/2010 | Abraham |
| 2010/0283534 | A1 | 11/2010 | Pierdomenico |
| 2010/0308919 | A1 | 12/2010 | Adamski et al. |
| 2011/0068757 | A1 | 3/2011 | Xu et al. |
| 2011/0074373 | A1 | 3/2011 | Lin |
| 2011/0136452 | A1 | 6/2011 | Pratt et al. |
| 2011/0148705 | A1 | 6/2011 | Kenington |
| 2011/0175681 | A1 | 7/2011 | Inamori et al. |
| 2011/0199156 | A1 | 8/2011 | Hayakawa |
| 2011/0223875 | A1 | 9/2011 | Hamano |
| 2011/0279179 | A1 | 11/2011 | Vice |
| 2012/0062031 | A1 | 3/2012 | Buthker |
| 2012/0139641 | A1 | 6/2012 | Kaczman et al. |
| 2012/0142304 | A1 | 6/2012 | Degani et al. |
| 2012/0146731 | A1 | 6/2012 | Khesbak |
| 2012/0194274 | A1 | 8/2012 | Fowers et al. |
| 2012/0200435 | A1 | 8/2012 | Ngo et al. |
| 2012/0274134 | A1 | 11/2012 | Gasparini et al. |
| 2012/0281597 | A1 | 11/2012 | Khlat et al. |
| 2012/0286576 | A1 | 11/2012 | Jing et al. |
| 2012/0299645 | A1 | 11/2012 | Southcombe et al. |
| 2012/0299647 | A1 | 11/2012 | Honjo et al. |
| 2012/0302179 | A1 | 11/2012 | Brobston |
| 2012/0309333 | A1 | 12/2012 | Nambu et al. |
| 2012/0326691 | A1 | 12/2012 | Kuan et al. |
| 2013/0021827 | A1 | 1/2013 | Ye |
| 2013/0063118 | A1 | 3/2013 | Nguyen et al. |
| 2013/0072139 | A1 | 3/2013 | Kang et al. |
| 2013/0100991 | A1 | 4/2013 | Woo |
| 2013/0127548 | A1 | 5/2013 | Popplewell et al. |
| 2013/0130724 | A1 | 5/2013 | Kumar Reddy et al. |
| 2013/0141064 | A1 | 6/2013 | Kay et al. |
| 2013/0141159 | A1 | 6/2013 | Strange et al. |
| 2013/0162233 | A1 | 6/2013 | Marty |
| 2013/0176961 | A1 | 7/2013 | Kanamarlapudi et al. |
| 2013/0187711 | A1 | 7/2013 | Goedken et al. |
| 2013/0200865 | A1 | 8/2013 | Wimpenny |
| 2013/0207731 | A1 | 8/2013 | Balteanu |
| 2013/0234513 | A1 | 9/2013 | Bayer |
| 2013/0234692 | A1 | 9/2013 | Liang et al. |
| 2013/0271221 | A1 | 10/2013 | Levesque et al. |
| 2013/0285750 | A1 | 10/2013 | Chowdhury et al. |
| 2013/0288612 | A1 | 10/2013 | Afsahi et al. |
| 2014/0009226 | A1 | 1/2014 | Severson |
| 2014/0028370 | A1 | 1/2014 | Wimpenny |
| 2014/0028390 | A1 | 1/2014 | Davis |
| 2014/0055197 | A1 | 2/2014 | Khlat et al. |
| 2014/0057684 | A1 | 2/2014 | Khlat |
| 2014/0097820 | A1 | 4/2014 | Miyamae |
| 2014/0103995 | A1 | 4/2014 | Langer |
| 2014/0111279 | A1 | 4/2014 | Brobston |
| 2014/0145692 | A1 | 5/2014 | Miyamae |
| 2014/0155002 | A1 | 6/2014 | Dakshinamurthy et al. |
| 2014/0169427 | A1 | 6/2014 | Asensio et al. |
| 2014/0184335 | A1 | 7/2014 | Nobbe et al. |
| 2014/0199949 | A1 | 7/2014 | Nagode et al. |
| 2014/0203869 | A1 | 7/2014 | Khlat et al. |
| 2014/0210550 | A1 | 7/2014 | Mathe et al. |
| 2014/0213196 | A1 | 7/2014 | Langer et al. |
| 2014/0218109 | A1 | 8/2014 | Wimpenny |
| 2014/0235185 | A1 | 8/2014 | Drogi |
| 2014/0266423 | A1 | 9/2014 | Drogi et al. |
| 2014/0266428 | A1 | 9/2014 | Chiron et al. |
| 2014/0273897 | A1 | 9/2014 | Drogi et al. |
| 2014/0306756 | A1 | 10/2014 | Henshaw et al. |
| 2014/0306763 | A1 | 10/2014 | Hong et al. |
| 2014/0306769 | A1 | 10/2014 | Khlat et al. |
| 2014/0315504 | A1 | 10/2014 | Sakai et al. |
| 2014/0354251 | A1 | 12/2014 | Williams |
| 2014/0361830 | A1 | 12/2014 | Mathe et al. |
| 2014/0361837 | A1 | 12/2014 | Strange et al. |
| 2015/0009980 | A1 | 1/2015 | Modi et al. |
| 2015/0048883 | A1 | 2/2015 | Vinayak |
| 2015/0071382 | A1 | 3/2015 | Wu et al. |
| 2015/0091645 | A1 | 4/2015 | Park et al. |
| 2015/0098523 | A1 | 4/2015 | Lim et al. |
| 2015/0123628 | A1 | 5/2015 | Bhattad et al. |
| 2015/0139358 | A1 | 5/2015 | Asuri et al. |
| 2015/0145600 | A1 | 5/2015 | Hur et al. |
| 2015/0155836 | A1 | 6/2015 | Midya et al. |
| 2015/0188432 | A1 | 7/2015 | Vannorsdel et al. |
| 2015/0194988 | A1 | 7/2015 | Yan et al. |
| 2015/0234402 | A1 | 8/2015 | Kay et al. |
| 2015/0236652 | A1 | 8/2015 | Yang et al. |
| 2015/0236654 | A1 | 8/2015 | Jiang et al. |
| 2015/0236729 | A1 | 8/2015 | Peng et al. |
| 2015/0236877 | A1 | 8/2015 | Peng et al. |
| 2015/0280652 | A1 | 10/2015 | Cohen |
| 2015/0302845 | A1 | 10/2015 | Nakano et al. |
| 2015/0311791 | A1 | 10/2015 | Tseng et al. |
| 2015/0326114 | A1 | 11/2015 | Rolland |
| 2015/0333781 | A1 | 11/2015 | Alon et al. |

(56) References Cited

U.S. PATENT DOCUMENTS

| | | |
|---|---|---|
| 2016/0036389 A1 | 2/2016 | Balteanu et al. |
| 2016/0050629 A1 | 2/2016 | Khesbak et al. |
| 2016/0065137 A1 | 3/2016 | Khlat |
| 2016/0065139 A1 | 3/2016 | Lee et al. |
| 2016/0094185 A1 | 3/2016 | Shute |
| 2016/0094186 A1 | 3/2016 | Cohen |
| 2016/0099686 A1 | 4/2016 | Perreault et al. |
| 2016/0099687 A1 | 4/2016 | Khlat |
| 2016/0105151 A1 | 4/2016 | Langer |
| 2016/0118941 A1 | 4/2016 | Wang |
| 2016/0126900 A1 | 5/2016 | Shute |
| 2016/0164550 A1 | 6/2016 | Pilgram |
| 2016/0164551 A1 | 6/2016 | Khlat et al. |
| 2016/0173031 A1 | 6/2016 | Langer |
| 2016/0181995 A1 | 6/2016 | Nentwig et al. |
| 2016/0187627 A1 | 6/2016 | Abe |
| 2016/0197627 A1 | 7/2016 | Qin et al. |
| 2016/0204809 A1 | 7/2016 | Pratt et al. |
| 2016/0226448 A1 | 8/2016 | Wimpenny |
| 2016/0249300 A1 | 8/2016 | Tsai et al. |
| 2016/0294587 A1 | 10/2016 | Jiang et al. |
| 2017/0005619 A1 | 1/2017 | Khlat |
| 2017/0005676 A1 | 1/2017 | Yan et al. |
| 2017/0006543 A1 | 1/2017 | Khlat |
| 2017/0012675 A1 | 1/2017 | Frederick |
| 2017/0018718 A1 | 1/2017 | Jang et al. |
| 2017/0070199 A1 | 3/2017 | Anderson et al. |
| 2017/0077877 A1 | 3/2017 | Anderson |
| 2017/0093340 A1 | 3/2017 | Khesbak |
| 2017/0141736 A1 | 5/2017 | Pratt et al. |
| 2017/0149240 A1 | 5/2017 | Wu et al. |
| 2017/0187187 A1 | 6/2017 | Amin et al. |
| 2017/0207802 A1 | 7/2017 | Pratt et al. |
| 2017/0230924 A1 | 8/2017 | Wolberg et al. |
| 2017/0279412 A1 | 9/2017 | Afsahi et al. |
| 2017/0288612 A1 | 10/2017 | Khlat et al. |
| 2017/0302183 A1 | 10/2017 | Young |
| 2017/0317913 A1 | 11/2017 | Kim et al. |
| 2017/0331433 A1 | 11/2017 | Khlat |
| 2017/0338773 A1 | 11/2017 | Balteanu et al. |
| 2017/0353287 A1 | 12/2017 | Onaka et al. |
| 2018/0013465 A1 | 1/2018 | Chiron et al. |
| 2018/0048265 A1 | 2/2018 | Nentwig |
| 2018/0048276 A1 | 2/2018 | Khlat et al. |
| 2018/0076772 A1 | 3/2018 | Khesbak et al. |
| 2018/0123453 A1 | 5/2018 | Puggelli et al. |
| 2018/0123516 A1 | 5/2018 | Kim et al. |
| 2018/0138862 A1 | 5/2018 | Balteanu et al. |
| 2018/0138863 A1 | 5/2018 | Khlat |
| 2018/0152144 A1 | 5/2018 | Choo et al. |
| 2018/0159476 A1 | 6/2018 | Balteanu et al. |
| 2018/0159566 A1 | 6/2018 | Dinur et al. |
| 2018/0254530 A1 | 9/2018 | Wigney |
| 2018/0287564 A1 | 10/2018 | Afsahi et al. |
| 2018/0288697 A1 | 10/2018 | Camuffo et al. |
| 2018/0302042 A1 | 10/2018 | Zhang et al. |
| 2018/0309409 A1 | 10/2018 | Khlat |
| 2018/0309414 A1 | 10/2018 | Khlat et al. |
| 2018/0316440 A1 | 11/2018 | Mita |
| 2018/0358930 A1 | 12/2018 | Haine |
| 2018/0367101 A1 | 12/2018 | Chen et al. |
| 2018/0375476 A1 | 12/2018 | Balteanu et al. |
| 2018/0375483 A1 | 12/2018 | Balteanu et al. |
| 2019/0028060 A1 | 1/2019 | Jo et al. |
| 2019/0036493 A1 | 1/2019 | Khlat et al. |
| 2019/0044480 A1 | 2/2019 | Khlat |
| 2019/0068051 A1 | 2/2019 | Yang et al. |
| 2019/0068234 A1 | 2/2019 | Khlat et al. |
| 2019/0089310 A1 | 3/2019 | Khlat et al. |
| 2019/0097277 A1 | 3/2019 | Fukae |
| 2019/0103766 A1 | 4/2019 | Von Novak, III et al. |
| 2019/0109566 A1 | 4/2019 | Folkmann et al. |
| 2019/0109613 A1 | 4/2019 | Khlat et al. |
| 2019/0181804 A1 | 6/2019 | Khlat |
| 2019/0199215 A1 | 6/2019 | Zhao et al. |
| 2019/0222175 A1 | 7/2019 | Khlat et al. |
| 2019/0222176 A1 | 7/2019 | Khlat |
| 2019/0222178 A1 | 7/2019 | Khlat et al. |
| 2019/0222181 A1 | 7/2019 | Khlat |
| 2019/0229623 A1 | 7/2019 | Tsuda et al. |
| 2019/0238095 A1 | 8/2019 | Khlat |
| 2019/0253023 A1 | 8/2019 | Yang et al. |
| 2019/0267947 A1 | 8/2019 | Khlat et al. |
| 2019/0267956 A1 | 8/2019 | Granger-Jones et al. |
| 2019/0288645 A1 | 9/2019 | Nag et al. |
| 2019/0319584 A1 | 10/2019 | Khlat et al. |
| 2019/0334480 A1 | 10/2019 | Nomiyama et al. |
| 2019/0356285 A1 | 11/2019 | Khlat et al. |
| 2019/0386565 A1 | 12/2019 | Rosolowski et al. |
| 2020/0007090 A1 | 1/2020 | Khlat et al. |
| 2020/0036337 A1 | 1/2020 | Khlat |
| 2020/0076375 A1 | 3/2020 | Khlat |
| 2020/0076376 A1 | 3/2020 | Khlat |
| 2020/0091878 A1 | 3/2020 | Maxim et al. |
| 2020/0106392 A1 | 4/2020 | Khlat et al. |
| 2020/0127607 A1 | 4/2020 | Khlat |
| 2020/0127608 A1 | 4/2020 | Khlat |
| 2020/0127609 A1 | 4/2020 | Khlat |
| 2020/0127611 A1 | 4/2020 | Khlat |
| 2020/0127612 A1 | 4/2020 | Khlat et al. |
| 2020/0127625 A1 | 4/2020 | Khlat |
| 2020/0127730 A1 | 4/2020 | Khlat |
| 2020/0136561 A1 | 4/2020 | Khlat et al. |
| 2020/0136563 A1 | 4/2020 | Khlat |
| 2020/0136575 A1 | 4/2020 | Khlat et al. |
| 2020/0144966 A1 | 5/2020 | Khlat |
| 2020/0153394 A1 | 5/2020 | Khlat et al. |
| 2020/0177131 A1 | 6/2020 | Khlat |
| 2020/0204116 A1 | 6/2020 | Khlat |
| 2020/0228063 A1 | 7/2020 | Khlat |
| 2020/0259456 A1 | 8/2020 | Khlat |
| 2020/0259685 A1 | 8/2020 | Khlat |
| 2020/0266766 A1 | 8/2020 | Khlat et al. |
| 2020/0295708 A1 | 9/2020 | Khlat |
| 2020/0295710 A1 | 9/2020 | Khlat |
| 2020/0295713 A1 | 9/2020 | Khlat |
| 2020/0304020 A1 | 9/2020 | Lu et al. |
| 2020/0313622 A1 | 10/2020 | Eichler et al. |
| 2020/0321848 A1 | 10/2020 | Khlat |
| 2020/0321917 A1 | 10/2020 | Nomiyama et al. |
| 2020/0328677 A1 | 10/2020 | Amin et al. |
| 2020/0328720 A1 | 10/2020 | Khlat |
| 2020/0336105 A1 | 10/2020 | Khlat |
| 2020/0336111 A1 | 10/2020 | Khlat |
| 2020/0343859 A1 | 10/2020 | Khlat |
| 2020/0350865 A1 | 11/2020 | Khlat |
| 2020/0350866 A1 | 11/2020 | Pehlke |
| 2020/0350878 A1 | 11/2020 | Drogi et al. |
| 2020/0382061 A1 | 12/2020 | Khlat |
| 2020/0382062 A1 | 12/2020 | Khlat |
| 2020/0382066 A1 | 12/2020 | Khlat |
| 2020/0382074 A1 | 12/2020 | Khlat |
| 2021/0006206 A1 | 1/2021 | Khlat |
| 2021/0036596 A1 | 2/2021 | Jeon et al. |
| 2021/0036604 A1 | 2/2021 | Khlat et al. |
| 2021/0075372 A1 | 3/2021 | Henzler et al. |
| 2021/0099137 A1 | 4/2021 | Drogi et al. |
| 2021/0159590 A1 | 5/2021 | Na et al. |
| 2021/0175896 A1 | 6/2021 | Melanson et al. |
| 2021/0184708 A1 | 6/2021 | Khlat |
| 2021/0194437 A1 | 6/2021 | Stockert |
| 2021/0194515 A1 | 6/2021 | Go et al. |
| 2021/0194517 A1 | 6/2021 | Mirea et al. |
| 2021/0194522 A1 | 6/2021 | Stockert et al. |
| 2021/0211108 A1 | 7/2021 | Khlat |
| 2021/0226585 A1 | 7/2021 | Khlat |
| 2021/0234513 A1 | 7/2021 | Khlat |
| 2021/0257971 A1 | 8/2021 | Kim et al. |
| 2021/0265953 A1 | 8/2021 | Khlat |
| 2021/0281228 A1 | 9/2021 | Khlat |
| 2021/0288615 A1 | 9/2021 | Khlat |
| 2021/0305944 A1 | 9/2021 | Scott et al. |
| 2021/0356299 A1 | 11/2021 | Park |
| 2021/0384869 A1 | 12/2021 | Khlat |

(56) References Cited

U.S. PATENT DOCUMENTS

| | | | |
|---|---|---|---|
| 2022/0021348 A1 | 1/2022 | Philpott et al. |
| 2022/0094256 A1 | 3/2022 | Radhakrishnan et al. |
| 2022/0103137 A1 | 3/2022 | Khlat et al. |
| 2022/0123697 A1 | 4/2022 | Elgaard et al. |
| 2022/0123698 A1 | 4/2022 | Goto et al. |
| 2022/0123744 A1 | 4/2022 | Khlat |
| 2022/0181974 A1 | 6/2022 | Liu et al. |
| 2022/0224294 A1 | 7/2022 | Khlat et al. |
| 2022/0255513 A1 | 8/2022 | Khlat |
| 2022/0263474 A1 | 8/2022 | Khlat |
| 2022/0271714 A1 | 8/2022 | Khlat |
| 2022/0278651 A1 | 9/2022 | Khlat |
| 2022/0286094 A1 | 9/2022 | Granger-Jones et al. |
| 2022/0385239 A1 | 12/2022 | Khlat |
| 2022/0399861 A1 | 12/2022 | Khlat |
| 2023/0081095 A1 | 3/2023 | Khlat |
| 2023/0113677 A1 | 4/2023 | Boley et al. |
| 2024/0014787 A1 | 1/2024 | Khlat |

FOREIGN PATENT DOCUMENTS

| | | |
|---|---|---|
| CN | 104185953 A | 12/2014 |
| CN | 104620509 A | 5/2015 |
| CN | 104954301 A | 9/2015 |
| CN | 105322894 A | 2/2016 |
| CN | 105680807 A | 6/2016 |
| CN | 105703716 A | 6/2016 |
| CN | 105721366 A | 6/2016 |
| CN | 106208974 A | 12/2016 |
| CN | 106209270 A | 12/2016 |
| CN | 106877824 A | 6/2017 |
| CN | 107093987 A | 8/2017 |
| CN | 107980205 A | 5/2018 |
| CN | 108141184 A | 6/2018 |
| CN | 109150212 A | 1/2019 |
| CN | 109478870 A | 3/2019 |
| DE | 102019220150 A1 | 6/2020 |
| EP | 3174199 A2 | 5/2012 |
| EP | 2909928 A1 | 8/2015 |
| EP | 3644500 A1 | 4/2020 |
| JP | H03104422 A | 5/1991 |
| JP | 2015216670 A | 12/2015 |
| JP | 2020182090 A | 11/2020 |
| JP | 2022549857 A | 11/2022 |
| KR | 1020140121868 A | 10/2014 |
| WO | 2018182778 A1 | 10/2018 |
| WO | 2020206246 A1 | 10/2020 |
| WO | 2021016350 A1 | 1/2021 |
| WO | 2021046453 A1 | 3/2021 |
| WO | 2022103493 A1 | 5/2022 |

OTHER PUBLICATIONS

Final Office Action for U.S. Appl. No. 17/942,472, mailed Jul. 19, 2023, 16 pages.

Advisory Action for U.S. Appl. No. 17/942,472, mailed Sep. 15, 2023, 3 pages.

Notice of Allowance for U.S. Appl. No. 17/073,764, mailed Aug. 23, 2023, 12 pages.

Non-Final Office Action for U.S. Appl. No. 16/263,368, mailed Dec. 26, 2019, 6 pages.

Notice of Allowance for U.S. Appl. No. 16/273,288, mailed Dec. 13, 2019, 8 pages.

Non-Final Office Action for U.S. Appl. No. 16/263,316, mailed Dec. 23, 2019, 9 pages.

Notice of Allowance for U.S. Appl. No. 16/193,513, mailed Mar. 25, 2020, 8 pages.

Non-Final Office Action for U.S. Appl. No. 16/250,229, mailed Apr. 29, 2020, 7 pages.

Non-Final Office Action for U.S. Appl. No. 16/267,740, mailed Apr. 30, 2020, 10 pages.

Final Office Action for U.S. Appl. No. 16/263,316, mailed May 13, 2020, 10 pages.

Non-Final Office Action for U.S. Appl. No. 16/278,886, mailed Apr. 29, 2020, 9 pages.

Quayle Action for U.S. Appl. No. 16/267,779, mailed May 1, 2020, 8 pages.

Final Office Action for U.S. Appl. No. 16/263,368, mailed May 22, 2020, 9 pages.

Notice of Allowance for U.S. Appl. No. 16/250,229, mailed Sep. 22, 2020, 7 pages.

Quayle Action for U.S. Appl. No. 16/267,740, mailed Oct. 19, 2020, 7 pages.

Notice of Allowance for U.S. Appl. No. 16/267,740, mailed Mar. 3, 2021, 8 pages.

Non-Final Office Action for U.S. Appl. No. 16/263,316, mailed Jul. 17, 2020, 4 pages.

Non-Final Office Action for U.S. Appl. No. 16/263,316, mailed Nov. 24, 2020, 4 pages.

Notice of Allowance for U.S. Appl. No. 16/263,316, mailed Mar. 30, 2021, 7 pages.

Notice of Allowance for U.S. Appl. No. 16/270,119, mailed Jun. 18, 2020, 9 pages.

Non-Final Office Action for U.S. Appl. No. 17/027,963, mailed Aug. 13, 2021, 6 pages.

Notice of Allowance for U.S. Appl. No. 16/278,886, mailed Sep. 22, 2020, 8 pages.

Non-Final Office Action for U.S. Appl. No. 16/250,298, mailed Aug. 20, 2020, 8 pages.

Quayle Action for U.S. Appl. No. 16/250,298, mailed Feb. 3, 2021, 5 pages.

Notice of Allowance for U.S. Appl. No. 16/250,298, mailed Apr. 15, 2021, 8 pages.

Non-Final Office Action for U.S. Appl. No. 16/689,236, mailed Mar. 2, 2021, 15 pages.

Notice of Allowance for U.S. Appl. No. 16/689,236, mailed Jun. 9, 2021, 7 pages.

Non-Final Office Action for U.S. Appl. No. 16/263,368, mailed Aug. 7, 2020, 4 pages.

Non-Final Office Action for U.S. Appl. No. 16/263,368, mailed Dec. 17, 2020, 8 pages.

Notice of Allowance for U.S. Appl. No. 16/263,368, mailed Apr. 29, 2021, 7 pages.

Notice of Allowance for U.S. Appl. No. 16/508,704, mailed Dec. 30, 2020, 7 pages.

Notice of Allowance for U.S. Appl. No. 16/508,768, mailed Oct. 27, 2020, 9 pages.

Quayle Action for U.S. Appl. No. 16/514,339, mailed Nov. 19, 2020, 9 pages.

Non-Final Office Action for U.S. Appl. No. 16/660,900, mailed Feb. 18, 2021, 7 pages.

Notice of Allowance for U.S. Appl. No. 16/689,417, mailed Feb. 24, 2021, 7 pages.

Non-Final Office Action for U.S. Appl. No. 16/669,728, mailed Jun. 3, 2021, 9 pages.

Final Office Action for U.S. Appl. No. 17/027,963, mailed Jan. 14, 2022, 4 pages.

Notice of Allowance for U.S. Appl. No. 17/027,963, mailed Mar. 30, 2022, 8 pages.

Notice of Allowance and Examiner-Initiated Interview Summary for U.S. Appl. No. 16/669,728, mailed Dec. 8, 2021, 8 pages.

International Search Report and Written Opinion for International Patent Application No. PCT/US2020/043067, mailed Nov. 11, 2020, 19 pages.

International Search Report and Written Opinion for International Patent Application No. PCT/US2021/052151, mailed Jan. 4, 2022, 16 pages.

Non-Final Office Action for U.S. Appl. No. 17/408,651, mailed Mar. 2, 2023, 13 pages.

Extended European Search Report for European Patent Application No. 22152966.2, mailed Jun. 23, 2022, 9 pages.

Non-Final Office Action for U.S. Appl. No. 17/942,472, mailed Feb. 16, 2023, 13 pages.

Extended European Search Report for European Patent Application No. 22195683.2, mailed Feb. 10, 2023, 12 pages.

(56)                References Cited

OTHER PUBLICATIONS

Examination Report for European Patent Application No. 22152966. 2, mailed Sep. 17, 2024, 4 pages.
Notice of Allowance for U.S. Appl. No. 18/039,805, mailed Sep. 26, 2024, 10 pages.
Ma, Hongyan, "Application and implementation of envelope tracking technology in mobile terminal RF power amplifier," Computers and Telecommunications, Oct. 2017, 18 pages.
First Office Action for Chinese Patent Application No. 201910092452. X, mailed Jul. 31, 2024, 17 pages.
First Office Action for Chinese Patent Application No. 201910512645. 6, mailed Jul. 3, 2024, 15 pages.
First Office Action for Chinese Patent Application No. 201911232472. 9, mailed Jul. 23, 2024, 10 pages.
First Office Action for Chinese Patent Application No. 201911312703. 7, mailed Jul. 16, 2024, 10 pages.
Non-Final Office Action for U.S. Patent Application No. 18/254, 155, mailed Sep. 4, 2024, 14 pages.
Corrected Notice of Allowability for U.S. Appl. No. 17/331,996, mailed Aug. 1, 2024, 6 pages.
Non-Final Office Action for U.S. Appl. No. 17/579,796, mailed Aug. 30, 2024, 6 pages.
Non-Final Office Action for U.S. Appl. No. 17/629,759, mailed Jul. 18, 2024, 7 pages.
Examination Report for European Patent Application No. 20754095. 6, mailed Sep. 13, 2024, 7 pages.
Notice of Allowance for U.S. Appl. No. 17/363,568, mailed Sep. 19, 2024, 6 pages.
Notice of Allowance for U.S. Appl. No. 17/629,759, mailed Oct. 9, 2024, 7 pages.
Quayle Action for U.S. Appl. No. 16/589,940, mailed Dec. 4, 2020, 8 pages.
Notice of Allowance for U.S. Appl. No. 16/122,611, mailed Jan. 13, 2021, 8 pages.
Notice of Allowance for U.S. Appl. No. 16/284,023, mailed Jan. 19, 2021, 7 pages.
Notice of Allowance for U.S. Appl. No. 16/416,812, mailed Feb. 16, 2021, 8 pages.
Notice of Allowance for U.S. Appl. No. 16/435,940, mailed Dec. 21, 2020, 7 pages.
Notice of Allowance for U.S. Appl. No. 16/774,060, mailed Feb. 3, 2021, 7 pages.
Notice of Allowance for U.S. Appl. No. 16/590,790, mailed Jan. 27, 2021, 7 pages.
Notice of Allowance for U.S. Appl. No. 16/661,061, mailed Feb. 10, 2021, 7 pages.
Notice of Allowance for U.S. Appl. No. 16/122,611, mailed Apr. 1, 2021, 8 pages.
Non-Final Office Action for U.S. Appl. No. 16/582,471, mailed Mar. 24, 2021, 11 pages.
Wan, F. et al., "Negative Group Delay Theory of a Four-Port RC-Network Feedback Operational Amplifier," IEEE Access, vol. 7, Jun. 13, 2019, IEEE, 13 pages.
Non-Final Office Action for U.S. Appl. No. 16/775,554, mailed Jun. 14, 2021, 5 pages.
Notice of Allowance for U.S. Appl. No. 16/582,471, mailed Jun. 22, 2021, 9 pages.
Non-Final Office Action for U.S. Appl. No. 16/597,952, mailed May 26, 2021, 7 pages.
Notice of Allowance for U.S. Appl. No. 16/834,049, mailed Jun. 24, 2021, 8 pages.
Chen, S. et al., "A 4.5 µW 2.4 GHz Wake-Up Receiver Based on Complementary Current-Reuse RF Detector," 2015 IEEE International Symposium on Circuits and Systems (ISCAS), May 24-27, 2015, IEEE, pp. 1214-1217.
Ying, K. et al., "A Wideband Envelope Detector with Low Ripple and High Detection Speed," 2018 IEEE International Symposium on Circuits and Systems (ISCAS), May 27-30, 2018, IEEE, 5 pages.
Notice of Allowance for U.S. Appl. No. 17/011,313, mailed Nov. 4, 2021, 8 pages.

Notice of Allowance for U.S. Appl. No. 16/582,471, mailed Feb. 1, 2022, 9 pages.
Non-Final Office Action for U.S. Appl. No. 16/597,952, mailed Nov. 10, 2021, 9 pages.
Quayle Action for U.S. Appl. No. 16/855,154, mailed Oct. 25, 2021, 6 pages.
Non-Final Office Action for U.S. Appl. No. 16/807,575, mailed Jan. 31, 2022, 12 pages.
International Search Report and Written Opinion for International Patent Application No. PCT/US2021/050892, mailed Jan. 5, 2022, 20 pages.
International Search Report and Written Opinion for International Patent Application No. PCT/US2021/054141 mailed Jan. 25, 2022, 15 pages.
Notice of Allowance for U.S. Appl. No. 17/115,982, mailed Nov. 12, 2021, 8 pages.
Non-Final Office Action for U.S. Appl. No. 17/126,561, mailed Oct. 14, 2021, 6 pages.
Non-Final Office Action for U.S. Appl. No. 17/032,553, mailed Mar. 21, 2022, 4 pages.
Non-Final Office Action for U.S. Appl. No. 17/073,764, mailed Dec. 24, 2021, 22 pages.
International Search Report and Written Opinion for International Patent Application No. PCT/US2021/052830, mailed Jan. 24, 2022, 13 pages.
Notice of Allowance for U.S. Appl. No. 15/964,762, mailed Mar. 18, 2019, 7 pages.
Non-Final Office Action for U.S. Appl. No. 16/263,316, mailed Dec. 23, 2019, 10 pages.
First Office Action for Chinese Patent Application No. 202010083654. 0, mailed May 12, 2023, 17 pages.
Notification to Grant for Chinese Patent Application No. 202010097807. 7, mailed Jul. 11, 2023, 14 pages.
Final Office Action for U.S. Appl. No. 16/807,575, mailed May 4, 2022, 12 pages.
Advisory Action for U.S. Appl. No. 16/807,575, mailed Jul. 28, 2022, 3 pages.
Notice of Allowance for U.S. Appl. No. 16/807,575, mailed Aug. 19, 2022, 8 pages.
International Preliminary Report on Patentability for International Patent Application No. PCT/US2021/050892, mailed Oct. 24, 2022, 20 pages.
International Preliminary Report on Patentability for International Patent Application No. PCT/US2021/052151, mailed Oct. 13, 2022, 21 pages.
International Preliminary Report on Patentability for International Patent Application No. PCT/US2021/054141, mailed Sep. 29, 2022, 20 pages.
Notice of Allowance for U.S. Appl. No. 17/148,064, mailed Aug. 18, 2022, 8 pages.
Non-Final Office Action for U.S. Appl. No. 17/146,765, mailed Sep. 7, 2022, 10 pages.
Non-Final Office Action for U.S. Appl. No. 17/163,642, mailed Aug. 17, 2022, 9 pages.
Final Office Action for U.S. Appl. No. 17/163,642, mailed Nov. 25, 2022, 13 pages.
Non-Final Office Action for U.S. Appl. No. 14/836,634, mailed May 16, 2016, 9 pages.
Non-Final Office Action for U.S. Appl. No. 14/868,890, mailed Jul. 14, 2016, 13 pages.
Non-Final Office Action for U.S. Appl. No. 15/792,909, mailed May 18, 2018, 13 pages.
Notice of Allowance for U.S. Appl. No. 15/459,449, mailed Mar. 28, 2018, 7 pages.
Notice of Allowance for U.S. Appl. No. 15/723,460, mailed Jul. 24, 2018, 8 pages.
Notice of Allowance for U.S. Appl. No. 15/704,131, mailed Jul. 17, 2018, 7 pages.
Notice of Allowance for U.S. Appl. No. 15/728,202, mailed Aug. 2, 2018, 7 pages.
Non-Final Office Action for U.S. Appl. No. 15/888,300, mailed Aug. 28, 2018, 11 pages.

(56) References Cited

OTHER PUBLICATIONS

Notice of Allowance for U.S. Appl. No. 15/792,909, mailed Dec. 19, 2018, 11 pages.

Notice of Allowance for U.S. Appl. No. 15/993,705, mailed Oct. 31, 2018, 7 pages.

Pfister, Henry, "Discrete-Time Signal Processing," Lecture Note, pfister.ee.duke.edu/courses/ece485/dtsp.pdf, Mar. 3, 2017, 22 pages.

Non-Final Office Action for U.S. Appl. No. 15/888,260, mailed May 2, 2019, 14 pages.

Non-Final Office Action for U.S. Appl. No. 15/986,948, mailed Mar. 28, 2019, 8 pages.

Non-Final Office Action for U.S. Appl. No. 16/018,426, mailed Apr. 11, 2019, 11 pages.

Supplemental Notice of Allowability for U.S. Appl. No. 15/902,244, mailed Mar. 20, 2019, 6 pages.

Notice of Allowance for U.S. Appl. No. 15/902,244, mailed Feb. 8, 2019, 8 pages.

Advisory Action for U.S. Appl. No. 15/888,300, mailed Jun. 5, 2019, 3 pages.

Notice of Allowance for U.S. Appl. No. 15/984,566, mailed May 21, 2019, 6 pages.

Notice of Allowance for U.S. Appl. No. 16/150,556, mailed Jul. 29, 2019, 7 pages.

Non-Final Office Action for U.S. Appl. No. 15/888,300, mailed Jun. 27, 2019, 17 pages.

Final Office Action for U.S. Appl. No. 15/986,948, mailed Aug. 27, 2019, 9 pages.

Advisory Action for U.S. Appl. No. 15/986,948, mailed Nov. 8, 2019, 3 pages.

Notice of Allowance for U.S. Appl. No. 15/986,948, mailed Dec. 13, 2019, 7 pages.

Final Office Action for U.S. Appl. No. 16/018,426, mailed Sep. 4, 2019, 12 pages.

Advisory Action for U.S. Appl. No. 16/018,426, mailed Nov. 19, 2019, 3 pages.

Notice of Allowance for U.S. Appl. No. 16/180,887, mailed Jan. 13, 2020, 8 pages.

Notice of Allowance for U.S. Appl. No. 15/888,300, mailed Jan. 14, 2020, 11 pages.

Non-Final Office Action for U.S. Appl. No. 16/122,611, mailed Mar. 11, 2020, 16 pages.

Corrected Notice of Allowability for U.S. Appl. No. 15/888,300, mailed Feb. 25, 2020, 7 pages.

Notice of Allowance for U.S. Appl. No. 16/018,426, mailed Mar. 31, 2020, 7 pages.

Non-Final Office Action for U.S. Appl. No. 16/174,535, mailed Feb. 4, 2020, 7 pages.

Quayle Action for U.S. Appl. No. 16/354,234, mailed Mar. 6, 2020, 8 pages.

Notice of Allowance for U.S. Appl. No. 16/354,234, mailed Apr. 24, 2020, 9 pages.

Non-Final Office Action for U.S. Appl. No. 16/246,859, mailed Apr. 28, 2020, 9 pages.

Corrected Notice of Allowability for U.S. Appl. No. 15/888,300, mailed May 13, 2020, 7 pages.

Notice of Allowance for U.S. Appl. No. 16/155,127, mailed Jun. 1, 2020, 8 pages.

Final Office Action for U.S. Appl. No. 16/174,535, mailed Jul. 1, 2020, 7 pages.

Non-Final Office Action for U.S. Appl. No. 16/284,023, mailed Jun. 24, 2020, 7 pages.

Non-Final Office Action for U.S. Appl. No. 16/435,940, mailed Jul. 23, 2020, 6 pages.

Final Office Action for U.S. Appl. No. 15/888,300, mailed Feb. 15, 2019, 15 pages.

Final Office Action for U.S. Appl. No. 16/122,611, mailed Sep. 18, 2020, 17 pages.

Advisory Action for U.S. Appl. No. 16/174,535, mailed Sep. 24, 2020, 3 pages.

Notice of Allowance for U.S. Appl. No. 16/174,535, mailed Oct. 29, 2020, 7 pages.

Notice of Allowance for U.S. Appl. No. 16/246,859, mailed Sep. 18, 2020, 8 pages.

Final Office Action for U.S. Appl. No. 16/284,023, mailed Nov. 3, 2020, 7 pages.

Quayle Action for U.S. Appl. No. 16/421,905, mailed Aug. 25, 2020, 5 pages.

Non-Final Office Action for U.S. Appl. No. 16/416,812, mailed Oct. 16, 2020, 8 pages.

Non-Final Office Action for U.S. Appl. No. 16/514,051, mailed Nov. 13, 2020, 9 pages.

Non-Final Office Action for U.S. Appl. No. 16/774,060, mailed Aug. 17, 2020, 6 pages.

Notice of Allowance for U.S. Appl. No. 16/122,611, mailed Dec. 1, 2020, 9 pages.

Intention to Grant for European Patent Application No. 21806074.7, mailed May 10, 2024, 27 pages.

Notice of Allowance for U.S. Appl. No. 17/363,568, mailed Apr. 17, 2024, 6 pages.

Notice of Allowance for U.S. Appl. No. 17/331,996, mailed Jun. 14, 2024, 9 pages.

Notice of Allowance for U.S. Appl. No. 17/351,560, mailed Apr. 19, 2024, 8 pages.

International Search Report and Written Opinion for International Patent Application No. PCT/US2023/085103, mailed Apr. 26, 2024, 17 pages.

Notice of Allowance for U.S. Appl. No. 17/163,642, mailed Mar. 1, 2023, 10 pages.

Final Office Action for U.S. Appl. No. 17/032,553, mailed Jul. 29, 2022, 6 pages.

Notice of Allowance for U.S. Appl. No. 17/032,553, mailed Oct. 11, 2022, 7 pages.

Final Office Action for U.S. Appl. No. 17/073,764, mailed Jun. 1, 2022, 22 pages.

Advisory Action for U.S. Appl. No. 17/073,764, mailed Aug. 23, 2022, 3 pages.

Non-Final Office Action for U.S. Appl. No. 17/073,764, mailed Sep. 30, 2022, 13 pages.

Final Office Action for U.S. Appl. No. 17/073,764, mailed Mar. 3, 2023, 14 pages.

Advisory Action for U.S. Appl. No. 17/073,764, mailed May 26, 2023, 3 pages.

Extended European Search Report for European Patent Application No. 22153526.3, mailed Jul. 13, 2022, 9 pages.

Written Opinion for International Patent Application No. PCT/US2021/052830, mailed Nov. 3, 2022, 7 pages.

International Preliminary Report on Patentability for International Patent Application No. PCT/US2021/052830, mailed Feb. 20, 2023, 21 pages.

Notification to Grant for Chinese Patent Application No. 202010083654.0, mailed Nov. 9, 2023, 8 pages.

Notice of Allowance for U.S. Appl. No. 17/363,568, mailed Jan. 3, 2024, 7 pages.

Non-Final Office Action for U.S. Appl. No. 17/343,912, mailed Dec. 14, 2023, 6 pages.

Quayle Action for U.S. Appl. No. 17/351,560, mailed Nov. 24, 2023, 7 pages.

Notice of Allowance for U.S. Appl. No. 17/351,560, mailed Jan. 4, 2024, 7 pages.

Examination Report for European Patent Application No. 21790723.7, mailed Mar. 7, 2024, 5 pages.

Notice of Allowance for U.S. Appl. No. 17/343,912, mailed Mar. 4, 2024, 7 pages.

Non-Final Office Action for U.S. Appl. No. 17/331,996, mailed Feb. 1, 2024, 9 pages.

Notice of Allowance for U.S. Appl. No. 17/331,996, mailed Mar. 1, 2024, 8 pages.

Quayle Action for U.S. Appl. No. 17/404,587, mailed Jan. 31, 2024, 8 pages.

Non-Final Office Action for U.S. Appl. No. 17/363,568, mailed Nov. 9, 2023, 8 pages.

(56)                    References Cited

OTHER PUBLICATIONS

Decision to Grant for Chinese Patent Application No. 202010083654.
0, mailed Sep. 11, 2023, 8 pages.
Notice of Allowance for U.S. Appl. No. 17/942,472, mailed Oct. 18,
2023, 10 pages.
Corrected Notice of Allowability and Response to Rule 312 Com-
munication for U.S. Appl. No. 17/942,472, mailed Nov. 17, 2023,
6 pages.
Office Action for Taiwanese Patent Application No. 110142582,
mailed Jun. 3, 2025, 24 pages.

POWER MANAGEMENT CIRCUIT OPERABLE WITH MULTIPLE SUPPLY VOLTAGES

RELATED APPLICATIONS

This application is a 35 USC 371 national phase filing of International Application No. PCT/US2021/052151, filed Sep. 27, 2021, which claims the benefit of provisional patent application Ser. No. 63/114,193, filed Nov. 16, 2020, the disclosures of which are incorporated herein by reference in their entireties.

FIELD OF THE DISCLOSURE

The technology of the disclosure relates generally to a power management circuit, and particularly an envelope tracking (ET) power management circuit.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as fifth-generation new-radio (5G-NR) technology configured to communicate a millimeter wave (mmWave) radio frequency (RF) signal(s) in an mmWave spectrum located above 12 GHz frequency. To achieve the higher data rates, a mobile communication device may employ a power amplifier(s) to increase output power of the mmWave RF signal(s) (e.g., maintaining sufficient energy per bit). However, the increased output power of mmWave RF signal(s) can lead to increased power consumption and thermal dissipation in the mobile communication device, thus compromising overall performance and user experiences.

Envelope tracking (ET) is a power management technology designed to improve efficiency of the power amplifier(s) to help reduce power consumption and thermal dissipation in the mobile communication device. The power amplifier(s) is typically configured to amplify the mmWave RF signal(s) based on an ET voltage(s). As the name suggests, the ET voltage(s) is generated in accordance with a time-variant power envelope(s) of the mmWave RF signal(s) being amplified by the power amplifier(s). Understandably, the better the ET voltage(s) tracks the time-variant power envelope(s) of the mmWave RF signal(s), the better ET performance and higher efficiency can be achieved at the power amplifier(s). Given that the time-variant power envelope(s) of the mmWave RF signal(s) can vary rapidly between peaks and bottoms, the ET voltage(s) must be adjusted swiftly based on an instantaneous power level of the mmWave RF signal(s) to maintain temporal alignment with the time-variant power envelope(s) at the power amplifier(s).

SUMMARY

Embodiments of the disclosure relate to a power management circuit operable with multiple supply voltages. In embodiments disclosed herein, the power management circuit includes a supply voltage circuit(s) capable of simultaneously generating multiple supply voltages at different voltage levels. The power management circuit also includes multiple envelope tracking (ET) voltage circuits each configured to generate a respective one of multiple ET voltages based on the multiple supply voltages. In this regard, each ET voltage circuit can dynamically use different supply voltages from time to time to generate the respective ET voltage. As a result, it is possible to prevent distortion (e.g., amplitude clipping) in any of the ET voltages, especially when large peak-to-average ratio (PAR) is expected in the ET voltages.

In one aspect, a power management circuit is provided. The power management circuit includes an ET integrated circuit (ETIC). The ETIC includes a supply voltage circuit configured to generate multiple supply voltages at multiple voltage levels, respectively. The ETIC also includes multiple ET voltage circuits each configured to generate a respective one of multiple of ET voltages based on the multiple supply voltages and a respective one of multiple target voltages.

In another aspect, a power management circuit is provided. The power management circuit includes a distributed ETIC. The distributed ETIC includes a distributed supply voltage circuit coupled to an ETIC and is configured to generate multiple distributed supply voltages based on a selected supply voltage received from the ETIC. The distributed ETIC also includes at least one distributed ET voltage circuit configured to generate at least one distributed ET voltage based on the multiple distributed supply voltages and at least one distributed target voltage.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
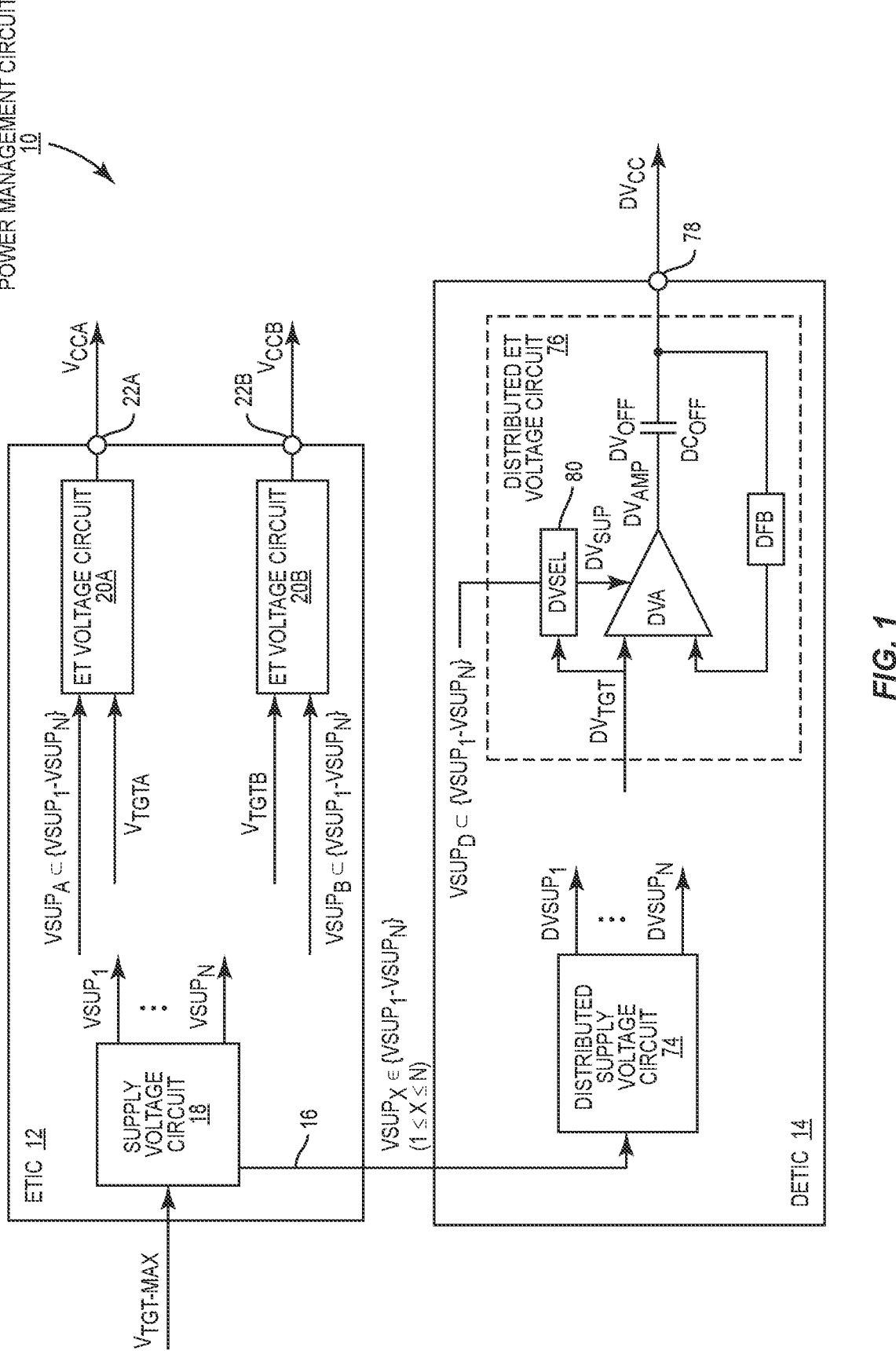
FIG. 1 is a schematic diagram of an exemplary power management circuit configured according to embodiments of the present disclosure to operate based on multiple supply voltages.
Figure 4A:
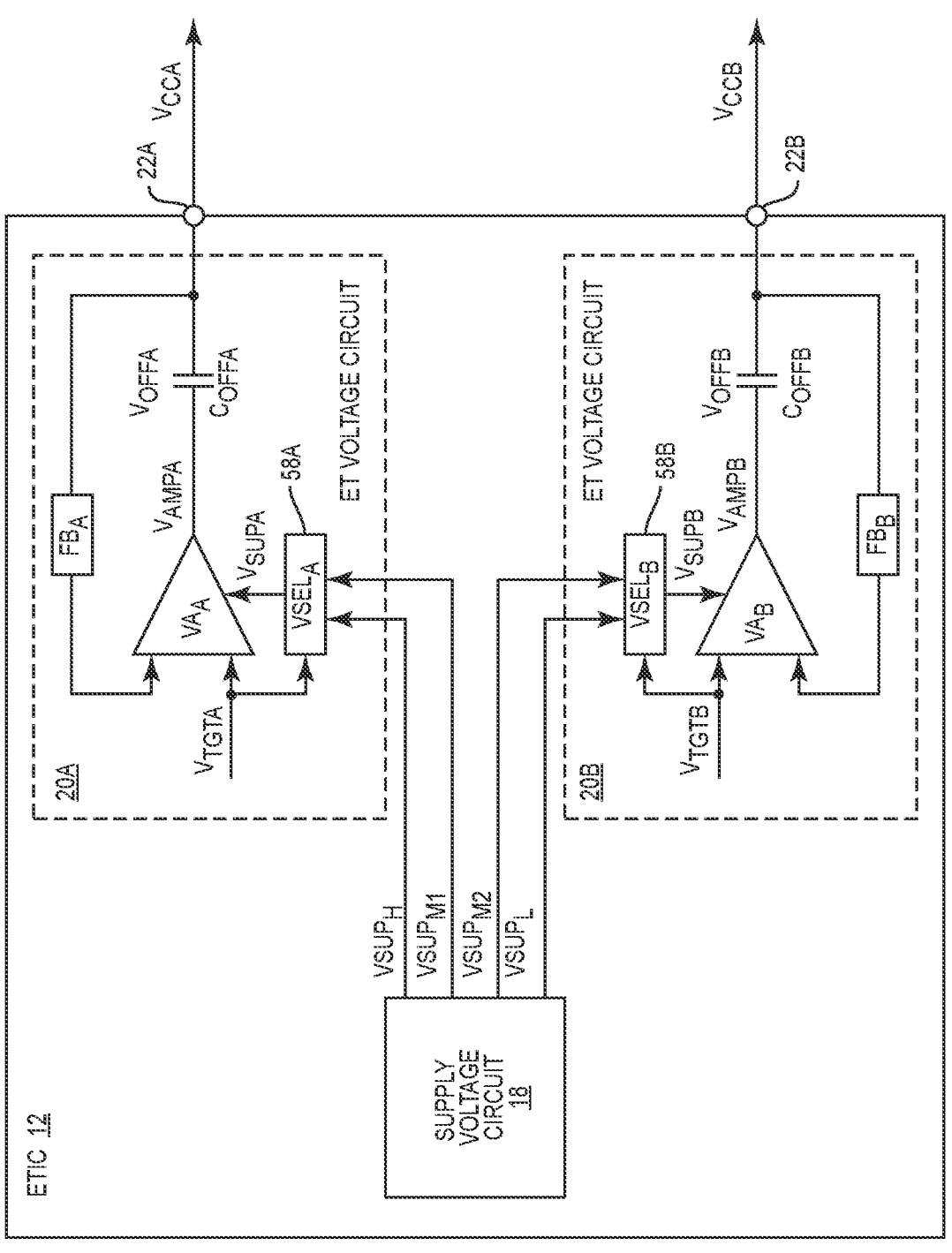
Figure 4B:
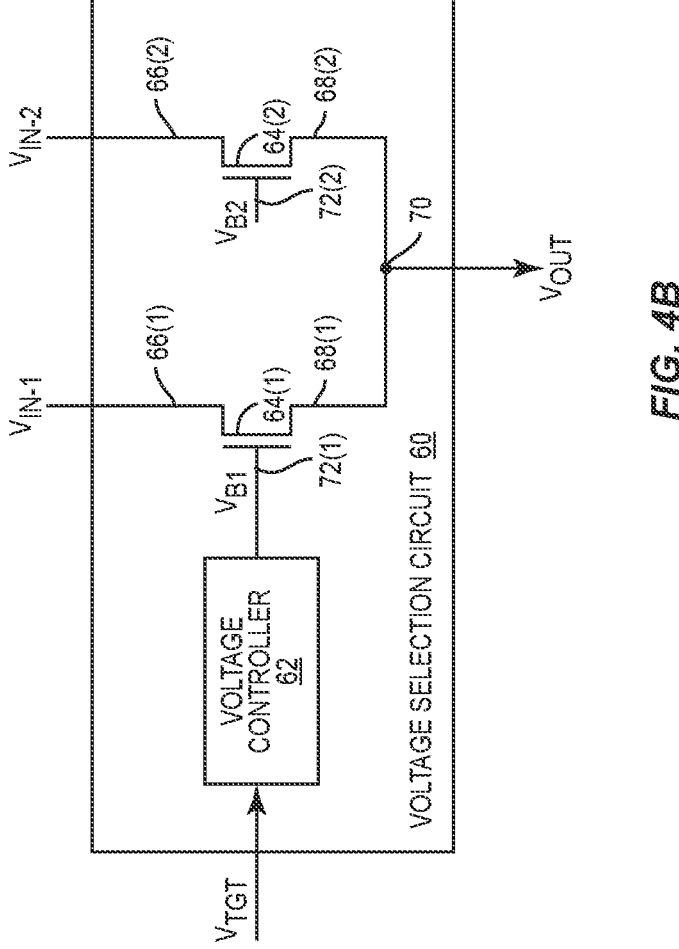

FIG. 4A is a schematic diagram providing an exemplary illustration of an ETIC in the power management circuit of FIG. 1 configured to generate an ET voltage(s) based on a subset of the supply voltages; and FIG. 4B is a schematic diagram of an exemplary voltage selection circuit, which can be provided in the ETIC in FIG. 4A to dynamically select any supply voltage from the subset of the supply voltages.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a power management circuit operable with multiple supply voltages. In embodiments disclosed herein, the power management circuit includes a supply voltage circuit(s) capable of simultaneously generating multiple supply voltages at different voltage levels. The power management circuit also includes multiple envelope tracking (ET) voltage circuits each configured to generate a respective one of multiple ET voltages based on the multiple supply voltages. In this regard, each ET voltage circuit can dynamically use different supply voltages from time to time to generate the respective ET voltage. As a result, it is possible to prevent distortion (e.g., amplitude clipping) in any of the ET voltages, especially when large peak-to-average ratio (PAR) is expected in the ET voltages.

FIG. 1 is a schematic diagram of an exemplary power management circuit 10 configured according to embodiments of the present disclosure to operate based on multiple supply voltages $VSUP_1$-$VSUP_N$. The power management circuit 10 includes an ET integrated circuit (ETIC) 12 and a distributed ETIC 14 (denoted as "DETIC"). Herein, the ETIC 12 and the distributed ETIC 14 are separate circuits coupled via a voltage line 16. In a non-limiting example, the ETIC 12 and the distributed ETIC 14 can be provided at different locations (e.g., top edge and bottom edge) of an electric device (e.g., smartphone).

The ETIC 12 is configured to include a supply voltage circuit 18. The supply voltage circuit 18 is configured to simultaneously generate the supply voltages $VSUP_1$-$VSUP_N$ at different voltage levels. The ETIC 12 also includes multiple ET voltage circuits 20A and 20B, each configured to generate a respective one of multiple ET voltages $V_{CCA}$ and $V_{CCB}$ at a respective one of multiple voltage outputs 22A and 22B based on a respective one of multiple target voltages $V_{TGTA}$ and $V_{TGTB}$.

In embodiments disclosed herein, the ET voltage circuit 20A is configured to generate the ET voltage $V_{CCA}$ based on at least a subset ($VSUP_A$) of the supply voltages $VSUP_1$-$VSUP_N$ ($VSUP_A \subset \{VSUP_1$-$VSUP_N\}$). Likewise, the ET voltage circuit 20B is configured to generate the ET voltage $V_{CCB}$ based on at least a subset ($VSUP_B$) of the supply voltages $VSUP_1$-$VSUP_N$ ($VSUP_B \subset \{VSUP_1$-$VSUP_N\}$). Accordingly, each of the ET voltage circuits 20A and 20B can dynamically select an appropriate one of the supply voltages $VSUP_1$-$VSUP_N$ with required headroom based on the respective one of the target voltages $V_{TGTA}$ and $V_{TGTB}$. As a result, it is possible to prevent distortion (e.g., amplitude clipping) in any of the ET voltages $V_{CCA}$ and $V_{CCB}$, especially when a large PAR is expected in the ET voltages $V_{CCA}$ and $V_{CCB}$.

In a non-limiting example, the supply voltage circuit 18 can be configured to generate a high supply voltage $VSUP_H$, a first medium supply voltage $VSUP_{M1}$, a second medium supply voltage $VSUP_{M2}$, and a low supply voltage $VSUP_L$ at different voltage levels ($VSUP_H \neq VSUP_{M1} \neq VSUP_{M2} \neq VSUP_B$). The first medium supply voltage $VSUP_{M1}$, the second medium supply voltage $VSUP_{M2}$, and the low supply voltage $VSUP_L$ can be determined based on the high supply voltage $VSUP_H$ in accordance with equation (Eq. 1) below.

$$VSUP_{M1}=VSUP_H*(1-x)/(1+x)$$

$$VSUP_{M2}=VSUP_H*x/(1+x)$$

$$VSUP_L=VSUP_H/(1+x) \tag{Eq. 1}$$

Figure 2:
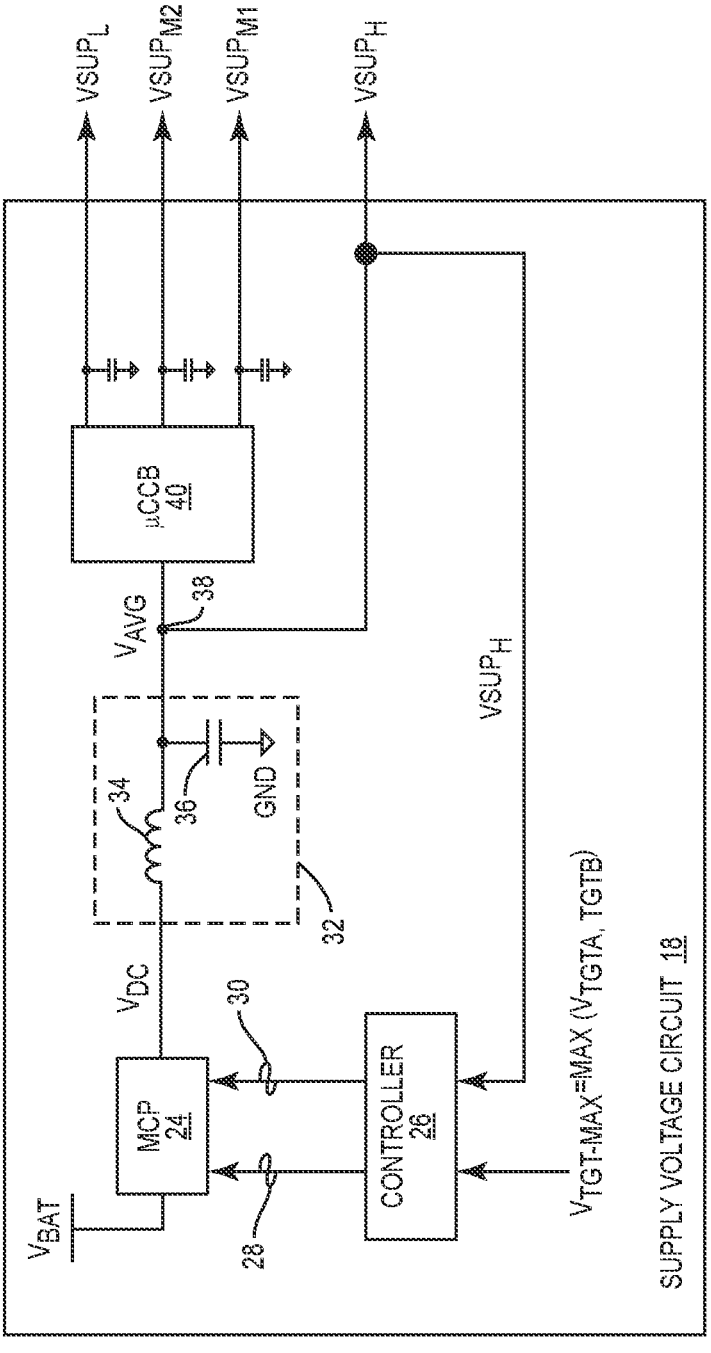
FIG. 2 is a schematic diagram providing an exemplary illustration of a supply voltage circuit in the power management circuit of FIG. 1 to generate the multiple supply voltages.

In the equation (Eq. 1) above, x represents a scaling factor $(0 \le x \le 1)$. For example, the scaling factor x can equal to 0, ¼, ½, ¾, or 1. FIG. 2 is a schematic diagram providing an exemplary illustration of the supply voltage circuit 18 in the ETIC 12 of the power management circuit 10 of FIG. 1. Common elements between FIGS. 1 and 2 are shown therein with common element numbers and will not be re-described herein.

The supply voltage circuit 18 includes a multi-level charge pump (MCP) 24. The MCP 24 is configured to generate a direct current (DC) voltage $V_{DC}$ based on a battery voltage $V_{BAT}$. In a non-limiting example, the MCP 24 can be a buck-boost circuit configured to operate in a buck mode to generate the DC voltage $V_{DC}$ as being less than or equal to the battery voltage $V_{BAT}$ or in a boost mode to generate the DC voltage $V_{DC}$ as being greater than the battery voltage $V_{BAT}$.

The supply voltage circuit 18 may include a controller 26, which can be a pulse width modulation (PWM) controller for example, configured to control the MCP 24. Specifically, the controller 26 may control the MCP 24 to operate in the buck mode and the boost mode based on a first control signal 28 and a second control signal 30, respectively. By alternating the first control signal 28 and the second control signal 30, it is possible to cause the MCP 24 to generate the DC voltage $V_{DC}$ in accordance with a specific duty cycle. In a non-limiting example, the controller 26 can determine the specific duty cycle based on a maximum target voltage $V_{TGT-MAX}$, which is determined based on a higher one of the target voltages $V_{TGTA}$ and $V_{TGTB}$ ($V_{TGT-MAX}=MAX$ ($V_{TGTA}$, $V_{TGTB}$)).

The MCP 24 is coupled to an inductor-capacitor (LC) circuit 32, which includes a power inductor 34 and a power capacitor 36. The LC circuit 32 is configured to output an average of the DC voltage $V_{DC}$ (referred herein as "average DC voltage $V_{AVG}$") at a coupling node 38 based on the specific duty cycle. In an embodiment, the supply voltage circuit 18 can be configured to directly output the average DC voltage $V_{AVG}$ as the high supply voltage $VSUP_H$. The supply voltage circuit 18 also includes a capacitor-based voltage circuit 40 (denoted as "μCBB"), which is coupled to the coupling node 38. In an embodiment, the capacitor-based voltage circuit 40 is configured to generate the first medium supply voltage $VSUP_{M1}$, the second medium supply voltage $VSUP_{M2}$, and the low supply voltage $VSUP_H$ as a function of the high supply voltage $VSUP_H$ in accordance with the equation (Eq. 1) above.

The controller 26 may be further configured to receive a feedback of the high supply voltage $VSUP_H$. Accordingly, the controller 26 may adjust the specific duty cycle of the MCP 24 based on both the maximum target voltage $V_{TGT-MAX}$ and the feedback of the high supply voltage $VSUP_H$. It should be appreciated that it is also possible for the controller 26 to receive feedback of the first medium supply voltage $VSUP_{M1}$, the second medium supply voltage $VSUP_{M2}$, or the low supply voltage $VSUP_L$ given the fact that the first medium supply voltage $VSUP_{M1}$, the second medium supply voltage $VSUP_{M2}$, and the low supply voltage $VSUP_L$ are all derived from the high supply voltage $VSUP_H$.

As previously discussed in FIG. 1, the ET voltage circuit 20A is configured to generate the ET voltage $V_{CCA}$ based on at least a subset ($VSUP_A$) of the supply voltages $VSUP_1$-$VSUP_H$ ($VSUP_A \subset \{VSUP_1$-$VSUP_N\}$). Likewise, the ET voltage circuit 20B is configured to generate the ET voltage $V_{CCB}$ based on at least a subset ($VSUP_B$) of the supply voltages $VSUP_1$-$VSUP_N$ ($VSUP_B \subset \{VSUP_1$-$VSUP_N\}$). In one embodiment, the subset $VSUP_A$ and the subset $VSUP_B$ can each include all of the supply voltages $VSUP_1$-$VSUP_N$.

In this regard, in a non-limiting example, each of the ET voltage circuits 20A and 20B in the ETIC 12 can be configured to receive all of the high supply voltage $VSUP_H$, the first medium supply voltage $VSUP_{M1}$, the second medium supply voltage $VSUP_{M2}$, and the low supply voltage $VSUP_L$. Accordingly, the ET voltage circuits 20A and 20B can each generate the respective one of the ET voltages $V_{CCA}$ and $V_{CCB}$ based on any of the high supply voltage $VSUP_H$, the first medium supply voltage $VSUP_{M1}$, the second medium supply voltage $VSUP_{M2}$, and the low supply voltage $VSUP_L$.

Figure 3A:
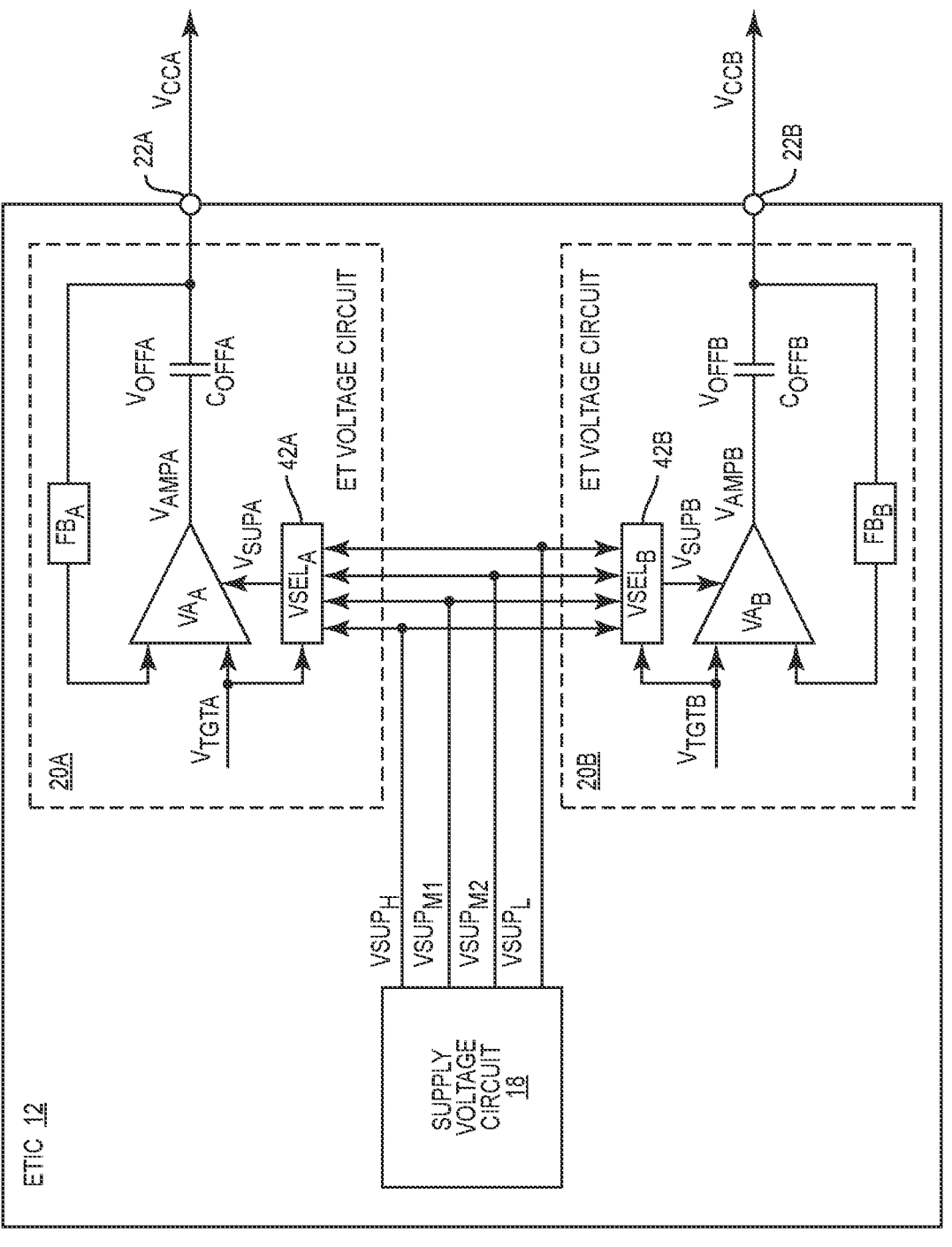
FIG. 3A is a schematic diagram providing an exemplary illustration of an envelope tracking (ET) integrated circuit (ETIC) in the power management circuit of FIG. 1 configured to generate an ET voltage(s) based on all of the supply voltages.

FIG. 3A is a schematic diagram providing an exemplary illustration of the ETIC 12 in FIG. 1 configured to generate each of the ET voltages $V_{CCA}$ and $V_{CCB}$ based on all of the high supply voltage $VSUP_H$, the first medium supply voltage $VSUP_{M1}$, the second medium supply voltage $VSUP_{M2}$, and the low supply voltage $VSUP_L$. Common elements between FIGS. 1 and 3A are shown therein with common element numbers and will not be re-described herein.

The ET voltage circuits 20A and 20B each include a respective one of multiple voltage amplifiers $VA_A$ and $VA_B$, a respective one of multiple offset capacitors $C_{OFFA}$ and $C_{OFFB}$, and a respective one of multiple feedback loops $FB_A$ and $FB_B$. The voltage amplifiers $VA_A$ and $VA_B$ are each configured to generate a respective one of multiple initial ET voltages $V_{AMPA}$ and $V_{AMPB}$ based on a respective one of the target voltages $V_{TGTA}$ and $V_{TGTB}$. The offset capacitors $C_{OFFA}$ and $C_{OFFB}$ are each configured to raise a respective one of the initial ET voltages $V_{AMPA}$ and $V_{AMPB}$ by a respective one of multiple offset voltages $V_{OFFA}$ and $V_{OFFB}$ to generate a respective one of the ET voltages $V_{CCA}$ and $V_{CCB}$ at a respective one of the voltage outputs 22A and 22B. The feedback loops $FB_A$ and $FB_B$ are each configured to provide feedback of a respective one of the ET voltages $V_{CCA}$ and $V_{CCB}$ to a respective one of the voltage amplifiers $VA_A$ and $VA_B$. In this regard, the ET voltage circuits 20A and 20B are both closed-loop ET circuits.

In an embodiment, the voltage amplifiers $VA_A$ and $VA_B$ are both configured to operate based on any of the high supply voltage $VSUP_H$, the first medium supply voltage $VSUP_{M1}$, the second medium supply voltage $VSUP_{M2}$, and the low supply voltage $VSUP_L$. As such, the supply voltage circuit 18 is configured to provide all of the high supply voltage $VSUP_H$, the first medium supply voltage $VSUP_{M1}$, the second medium supply voltage $VSUP_{M2}$, and the low supply voltage $VSUP_L$ to both the ET voltage circuits 20A and 20B.

The ET voltage circuits 20A and 20B are each configured to include a respective one of multiple voltage selection circuits 42A (denoted as "$VSEL_A$") and 42B (denoted as "$VSEL_B$"). The voltage selection circuits 42A and 42B are each coupled to the supply voltage circuit 18 to receive the high supply voltage $VSUP_H$, the first medium supply voltage $VSUP_{M1}$, the second medium supply voltage $VSUP_{M2}$, and the low supply voltage $VSUP_L$. Accordingly, the voltage selection circuits 42A and 42B are each configured to dynamically provide any one of the high supply voltage $VSUP_H$, the first medium supply voltage $VSUP_{M1}$, the second medium supply voltage $VSUP_{M2}$, and the low supply voltage $VSUP_L$ to a respective one of the voltage amplifiers $VA_A$ and $VA_B$. More specifically, the voltage selection circuit 42A can dynamically select a supply voltage $VSUP_H$ from the high supply voltage $VSUP_H$, the first medium supply voltage $VSUP_{M1}$, the second medium supply voltage $VSUP_{M2}$, and the low supply voltage $VSUP_L$ and provide the supply voltage $VSUP_H$ to the voltage amplifier $VA_A$. Similarly, the voltage selection circuit 42B can dynamically select a supply voltage $VSUP_B$ from the high supply voltage $VSUP_H$, the first medium supply voltage $VSUP_{M1}$, the second medium supply voltage $VSUP_{M2}$, and the low supply voltage $VSUP_L$ and provide the supply voltage $VSUP_B$ to the voltage amplifier $VA_B$.

Figure 3B:
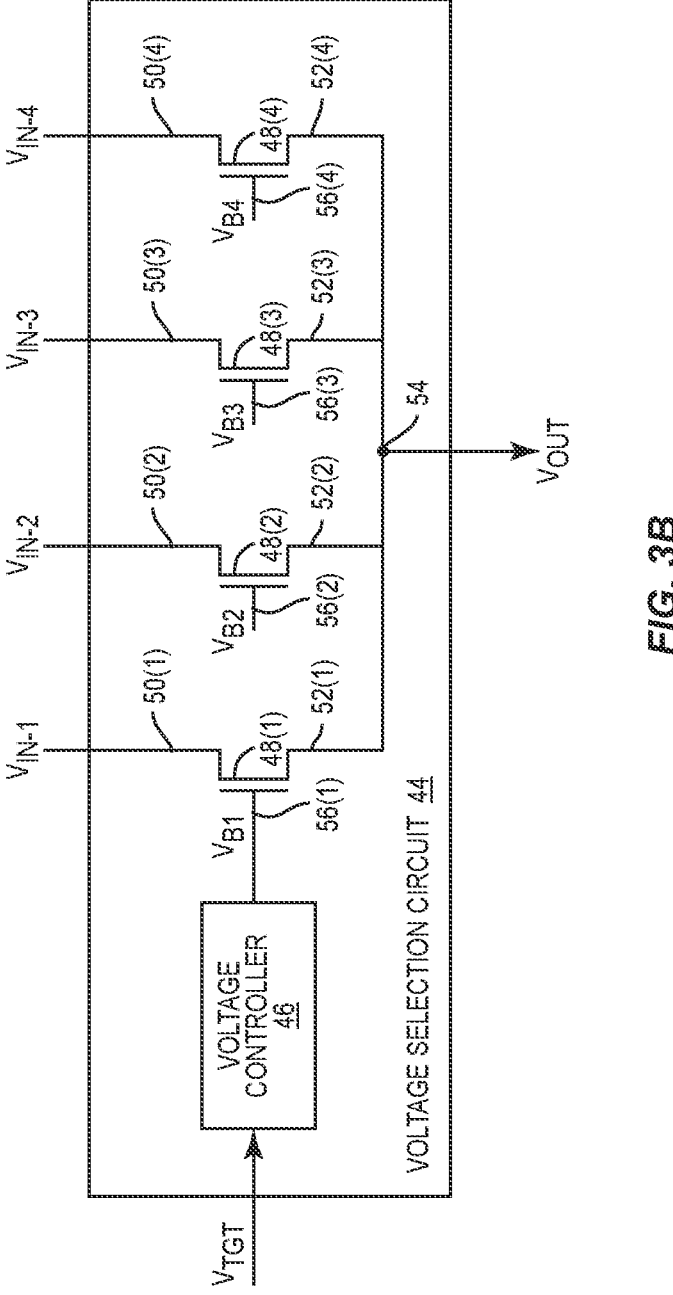
FIG. 3B is a schematic diagram of an exemplary voltage selection circuit, which can be provided in the ETIC in FIG. 3A to dynamically select any of the supply voltages.

FIG. 3B is a schematic diagram of an exemplary voltage selection circuit 44, which can be provided in the ETIC 12 in FIG. 3A as any of the voltage selection circuits 42A and 42B. Common elements between FIGS. 3A and 3B are shown therein with common element numbers and will not be re-described herein.

In a non-limiting example, the voltage selection circuit 44 includes a voltage controller 46 and multiple selection transistors 48(1)-48(4) (e.g., p-type or n-type field-effect transistors). Each of the selection transistors 48(1)-48(4) has a respective one of multiple first electrodes 50(1)-50(4) (e.g., collector electrode or drain electrode) configured to receive a respective one of multiple input voltages $V_{IN-1}$-$V_{IN-4}$. Herein, the input voltages $V_{IN-1}$-$V_{IN-4}$ are equivalent to the high supply voltage $VSUP_H$, the first medium supply voltage $VSUP_{M1}$, the second medium supply voltage $VSUP_{M2}$, and the low supply voltage $VSUP_L$, respectively.

Each of the selection transistors 48(1)-48(4) has a respective one of multiple second electrodes 52(1)-52(4) (e.g., emitter electrode or source electrode) coupled to an output node 54 to output any one of the input voltages $V_{IN-1}$-$V_{IN-4}$ as an output voltage VOUT. Herein, the output voltage VOUT is equivalent to the supply voltage $VSUP_A$ when the voltage selection circuit 44 is provided in the ET voltage circuit 20A as the voltage selection circuit 42A or the supply voltage $VSUP_B$ when the voltage selection circuit 44 is provided in the ET voltage circuit 20B as the voltage selection circuit 42B.

Each of the selection transistors 48(1)-48(4) has a respective one of multiple third electrodes 56(1)-56(4) (e.g., base electrode or gate electrode) coupled to the voltage controller 46. The voltage controller 46 is configured to receive a target voltage $V_{TGT}$, which can be the target voltage $V_{TGTA}$ when the voltage selection circuit 44 is provided in the ET voltage circuit 20A as the voltage selection circuit 42A or the target voltage $V_{TGTB}$ when the voltage selection circuit 44 is provided in the ET voltage circuit 20B as the voltage selection circuit 42B.

The voltage controller 46 is configured to dynamically determine, based on the target voltage $V_{TGT}$, which of the high supply voltage $VSUP_H$, the first medium supply voltage $VSUP_{M1}$, the second medium supply voltage $VSUP_{M2}$, and the low supply voltage $VSUP_L$ should be selected as the output voltage VOUT. Accordingly, the voltage controller 46 can assert a respective one of multiple bias voltages $V_{B1}$-$V_{B4}$ above a respective threshold voltage on a respective one of the third electrodes 56(1)-56(4) to thereby cause a respective one of the high supply voltage $VSUP_H$, the first medium supply voltage $VSUP_{M1}$, the second medium supply voltage $VSUP_{M2}$, and the low supply voltage $VSUP_L$ to be outputted at the output node 54.

As previously discussed in FIG. 1, the ET voltage circuit 20A is configured to generate the ET voltage $V_{CCA}$ based on at least a subset ($VSUP_A$) of the supply voltages $VSUP_1$-$VSUP_N$ ($VSUP_A \subset \{VSUP_1\text{-}VSUP_N\}$). Likewise, the ET voltage circuit 20B is configured to generate the ET voltage $V_{CCB}$ based on at least a subset ($VSUP_B$) of the supply voltages $VSUP_1$-$VSUP_N$ ($VSUP_B \subset \{VSUP_1\text{-}VSUP_N\}$). In one embodiment, the subset $VSUP_A$ and the subset $VSUP_B$ can each include a subset the supply voltages $VSUP_1$-$VSUP_N$.

In this regard, in a non-limiting example, each of the ET voltage circuits 20A and 20B in the ETIC 12 can be configured to receive a subset of the high supply voltage $VSUP_H$, the first medium supply voltage $VSUP_{M1}$, the second medium supply voltage $VSUP_{M2}$, and the low supply voltage $VSUP_L$. Accordingly, the ET voltage circuits 20A and 20B can each generate the respective one of the ET voltages $V_{CCA}$ and $V_{CCB}$ based on a respective subset of the high supply voltage $VSUP_H$, the first medium supply voltage $VSUP_{M1}$, the second medium supply voltage $VSUP_{M2}$, and the low supply voltage $VSUP_L$.

FIG. 4A is a schematic diagram providing an exemplary illustration of the ETIC 12 in FIG. 1 configured to generate each of the ET voltages $V_{CCA}$ and $V_{CCB}$ based on a respective subset of the high supply voltage $VSUP_H$, the first medium supply voltage $VSUP_{M1}$, the second medium supply voltage $VSUP_{M2}$, and the low supply voltage $VSUP_L$. Common elements between FIGS. 1, 3A, and 4A are shown therein with common element numbers and will not be re-described herein.

In an embodiment, the voltage amplifier $VA_A$ may be configured to operate based on the high supply voltage $VSUP_H$, the first medium supply voltage $VSUP_{M1}$, and the voltage amplifier $VA_B$ may be configured to operate based on the second medium supply voltage $VSUP_{M2}$, and the low supply voltage $VSUP_L$. As such, the supply voltage circuit 18 is configured to provide the high supply voltage $VSUP_H$ and the first medium supply voltage $VSUP_{M1}$ to the ET voltage circuit 20A and provide the second medium supply voltage $VSUP_{M2}$ and the low supply voltage $VSUP_L$ to the ET voltage circuit 20B.

The ET voltage circuits 20A and 20B are each configured to include a respective one of multiple voltage selection circuits 58A (denoted as "$VSEL_A$") and 58B (denoted as "$VSEL_B$"). The voltage selection circuits 58A and 58B are each coupled to the supply voltage circuit 18. The voltage selection circuit 58A receives the high supply voltage $VSUP_H$ and the first medium supply voltage $VSUP_{M1}$, and the voltage selection circuit 58B receives the second medium supply voltage $VSUP_{M2}$ and the low supply voltage $VSUP_L$. Accordingly, the voltage selection circuit 58A is configured to dynamically provide any one of the high supply voltage $VSUP_H$ and the first medium supply voltage $VSUP_{M1}$ to the voltage amplifier $VA_A$ as the supply voltage $VSUP_A$. Similarly, the voltage selection circuit 58B is configured to dynamically provide any one of the second medium supply voltage $VSUP_{M2}$ and the low supply voltage $VSUP_L$ to the voltage amplifier $VA_B$ as the supply voltage $VSUP_B$.

FIG. 4B is a schematic diagram of an exemplary voltage selection circuit 60, which can be provided in the ETIC 12 in FIG. 4A as any of the voltage selection circuits 58A and 58B. Common elements between FIGS. 4A and 4B are shown therein with common element numbers and will not be re-described herein.

In a non-limiting example, the voltage selection circuit 60 includes a voltage controller 62 and a pair of selection transistors 64(1)-64(2) (e.g., p-type or n-type field-effect transistors). Each of the selection transistors 64(1)-64(2) has a respective one of multiple first electrodes 66(1)-66(2) (e.g., collector electrode or drain electrode) configured to receive a respective one of a pair of input voltages $V_{IN-1}$-$V_{IN-2}$. Herein, the input voltages $V_{IN-1}$-$V_{IN-2}$ are equivalent to the high supply voltage $VSUP_H$ and the first medium supply voltage $VSUP_{M1}$ when the voltage selection circuit 60 is provided in the ET voltage circuit 20A as the voltage selection circuit 58A. Alternatively, the input voltages $V_{IN-1}$-$V_{IN-2}$ are equivalent to the second medium supply voltage $VSUP_{M2}$, and the low supply voltage $VSUP_L$ when the voltage selection circuit 60 is provided in the ET voltage circuit 20B as the voltage selection circuit 58B.

Each of the selection transistors 64(1)-64(2) has a respective one of multiple second electrodes 68(1)-68(2) (e.g., emitter electrode or source electrode) coupled to an output node 70 to output any one of the input voltages $V_{IN-1}$-$V_{IN-2}$ as an output voltage VOUT. Herein, the output voltage VOUT selects the supply voltage $VSUP_A$ when the voltage selection circuit 60 is provided in the ET voltage circuit 20A as the voltage selection circuit 58A or the supply voltage $VSUP_B$ when the voltage selection circuit 60 is provided in the ET voltage circuit as the voltage selection circuit 58B.

Each of the selection transistors 64(1)-64(2) has a respective one of multiple third electrodes 72(1)-72(2) (e.g., base electrode or gate electrode) coupled to the voltage controller 62. The voltage controller 62 is configured to receive a target voltage $V_{TGT}$, which can be the target voltage $V_{TGTA}$ when the voltage selection circuit 60 is provided in the ET voltage circuit 20A as the voltage selection circuit 58A or the target voltage $V_{TGTB}$ when the voltage selection circuit 60 is provided in the ET voltage circuit 20B as the voltage selection circuit 58B.

The voltage controller 62 is configured to dynamically determine, based on the target voltage $V_{TGT}$, which of the input voltages $V_{IN-1}$-$V_{IN-2}$ should be selected as the output voltage $V_{OUT}$. Accordingly, the voltage controller 62 can assert a respective one of multiple bias voltages $V_{B1}$-$V_{B2}$ above a respective threshold voltage on a respective one of the third electrodes 72(1)-72(2)) to thereby cause a respective one of input voltages $V_{IN-1}$-$V_{IN-2}$ to be outputted at the output node 70.

With reference back to FIG. 1, the distributed ETIC 14 can be configured to include a distributed supply voltage circuit 74. The distributed supply voltage circuit 74 is configured to simultaneously generate multiple distributed supply voltages $DVSUP_1$-$DVSUP_N$ at different voltage levels based on a selected supply voltage $VSUP_X$ ($1 \leq X \leq N$) of the plurality of supply voltages $VSUP_1$-$VSUP_N$. The distributed ETIC 14 also includes at least one distributed ET voltage circuit 76. The distributed ET voltage circuit 76 is configured to generate at least one distributed ET voltage $DV_{CC}$ in at least one distributed voltage output 78 based on at least one distributed target voltage $DV_{TGT}$.

In embodiments disclosed herein, the distributed ET voltage circuit 76 is configured to generate the distributed ET voltage $DV_{CC}$ based on at least a subset ($VSUP_D$) of the distributed supply voltages $DVSUP_1$-$DVSUP_N$ ($VSUP_D \subset \{DVSUP_1$-$DVSUP_N\}$). Accordingly, the distributed ET voltage circuit 76 can dynamically select an appropriate one of the distributed supply voltages $DVSUP_1$-$DVSUP_N$ with required headroom based on the distributed target voltage $DV_{TGT}$. As a result, it is possible to prevent distortion (e.g., amplitude clipping) in the distributed ET voltage $DV_{CC}$, especially when a large PAR is expected in the distributed ET voltage $DV_{CC}$.

In a non-limiting example, the supply voltage circuit 18 in the ETIC 12 can be configured to generate a high supply voltage $VSUP_H$, a first medium supply voltage $VSUP_{M1}$, a second medium supply voltage $VSUP_{M2}$, and a low supply voltage $VSUP_L$ at different voltage levels ($VSUP_H \neq VSUP_{M1} \neq VSUP_{M2} \neq VSUP_L$). In this regard, in a non-limiting example, the distributed supply voltage circuit 74 can receive the low supply voltage $VSUP_L$ from the supply voltage circuit 18 as the selected supply voltage $VSUP_X$. Accordingly, the distributed supply voltage circuit 74 may be configured to generate the distributed supply voltages $DVSUP_1$-$DVSUP_N$ to include a distributed high supply voltage $DVSUP_H$ (e.g., $DVSUP_1$), a distributed first medium supply voltage $DVSUP_{M1}$ (e.g., $DVSUP_2$), a distributed second medium supply voltage $DVSUP_{M2}$ (e.g., $DVSUP_{N-1}$), and a distributed low supply voltage $DVSUP_L$ (e.g., $DVSUP_N$) at different voltage levels ($DVSUP_H \neq DVSUP_{M1} \neq DVSUP_{M2} \neq DVSUP_L$) as a function of the selected supply voltage $VSUP_X$.

For example, the distributed low supply voltage $DVSUP_L$, the distributed high supply voltage $DVSUP_H$, the distributed first medium supply voltage $DVSUP_{M1}$, and the distributed second medium supply voltage $DVSUP_{M2}$ can be determined based on the selected supply voltage $VSUP_X$ in accordance with equation (Eq. 2) below.

$$DVSUP_L = VSUP_X$$

$$DVSUP_H = DVSUP_L*(1+y)$$

$$DVSUP_{M1} = DVSUP_L*(1-y)$$

$$DVSUP_{M2} = DVSUP_L*y \qquad \text{(Eq. 2)}$$

In the equation (Eq. 2) above, y represents a distributed scaling factor ($0 \leq y \leq 1$), which can be identical or different from the scaling factor x used by the supply voltage circuit 18 in the ETIC 12. In a non-limiting example, the distributed supply voltage circuit 74 can be implemented based on a similar configuration as the supply voltage circuit 18 in FIG. 2.

The distributed ET voltage circuit 76 includes a distributed voltage amplifier DVA, a distributed offset capacitor $DC_{OFF}$, and a distributed feedback loop DFB. The distributed voltage amplifier DVA is configured to generate a distributed initial ET voltage $DV_{AMP}$ based on a distributed target voltage $DV_{TGT}$ and a selected distributed supply voltage $DV_{SUP}$ among the distributed supply voltages $DVSUP_1$-$DVSUP_N$. The distributed offset capacitor $DC_{OFF}$ is configured to raise the distributed initial ET voltage $DV_{AMP}$ by a distributed offset voltage $DV_{OFF}$ to generate the distributed ET voltage $DV_{CC}$ at the distributed voltage output 78. The distributed feedback loop DFB is configured to provide feedback of the distributed ET voltages $DV_{CC}$ to the distributed voltage amplifier DVA. In this regard, the distributed ET voltage circuit 76 is also a closed-loop ET circuit.

In an embodiment, the distributed voltage amplifier DVA can be configured to operate based on any of the distributed high supply voltage $DVSUP_H$, the distributed first medium supply voltage $DVSUP_{M1}$, the distributed second medium supply voltage $DVSUP_{M2}$, and the distributed low supply voltage $DVSUP_L$. As such, the distributed supply voltage circuit 74 is configured to provide all of the distributed high supply voltage $DVSUP_H$, the distributed first medium supply voltage $DVSUP_{M1}$, the distributed second medium supply voltage $DVSUP_{M2}$, and the distributed low supply voltage $DVSUP_L$ to the distributed ET voltage circuit 76.

The distributed ET voltage circuit 76 is thus configured to include a distributed voltage selection circuit 80 (denoted as "DVSEL"). The distributed voltage selection circuit 80 is coupled to the distributed supply voltage circuit 74 to receive the distributed high supply voltage $DVSUP_H$, the distributed first medium supply voltage $DVSUP_{M1}$, the distributed second medium supply voltage $DVSUP_{M2}$, and the distributed low supply voltage $DVSUP_L$. Accordingly, the distributed voltage selection circuit 80 is configured to dynamically provide any one of the distributed high supply voltage $DVSUP_H$, the distributed first medium supply voltage $DVSUP_{M1}$, the distributed second medium supply voltage $DVSUP_{M2}$, and the distributed low supply voltage $DVSUP_L$ to the distributed voltage amplifier DVA as the selected distributed supply voltage $DV_{SUP}$. In this regard, the distributed voltage selection circuit 80 can be implemented in accordance with the voltage selection circuit 44 as in FIG. 3B.

In another embodiment, the distributed voltage amplifier DVA can be configured to operate based on a subset of the distributed high supply voltage $DVSUP_H$, the distributed first medium supply voltage $DVSUP_{M1}$, the distributed second medium supply voltage $DVSUP_{M2}$, and the distributed low supply voltage $DVSUP_L$. As such, the distributed supply voltage circuit 74 is configured to provide a subset of the distributed high supply voltage $DVSUP_H$, the distributed first medium supply voltage $DVSUP_{M1}$, the distributed second medium supply voltage $DVSUP_{M2}$, and the distributed low supply voltage $DVSUP_L$ to the distributed ET voltage circuit 76 as the selected distributed supply voltage $DV_{SUP}$. In this regard, the distributed voltage selection circuit 80 may be implemented in accordance with the voltage selection circuit 60 as in FIG. 4B.

Those skilled in the art will recognize improvements and modifications to the preferred embodiments of the present disclosure. All such improvements and modifications are considered within the scope of the concepts disclosed herein and the claims that follow.

What is claimed is:

1. A power management circuit comprising:
an envelope tracking (ET) integrated circuit (ETIC) comprising:
a supply voltage circuit configured to generate a plurality of supply voltages at a plurality of voltage levels, respectively; and
a plurality of ET voltage circuits each configured to generate a respective one of a plurality of ET voltages based on the plurality of supply voltages and a respective one of a plurality of target voltages; and
a distributed ETIC separated from the ETIC and comprising:
a distributed supply voltage circuit coupled to the ETIC and configured to generate a plurality of distributed supply voltages each as a function of a selected supply voltage among the plurality of supply voltages; and
at least one distributed ET voltage circuit configured to generate at least one distributed ET voltage based on the plurality of distributed supply voltages and at least one distributed target voltage.

2. The power management circuit of claim 1, wherein the plurality of ET voltage circuits each comprises:
a voltage amplifier configured to generate a respective initial ET voltage based on a selected supply voltage among the plurality of supply voltages; and
an offset capacitor configured to raise the respective initial ET voltage by a respective offset voltage to generate the respective one of the plurality of ET voltages.

3. The power management circuit of claim 2, wherein each of the plurality of ET voltage circuits further comprises a voltage selection circuit coupled to the voltage amplifier and configured to determine the selected supply voltage among the plurality of supply voltages based on the respective one of the plurality of target voltages.

4. The power management circuit of claim 3, where the voltage selection circuit in each of the plurality of ET voltage circuits is further configured to determine the selected supply voltage among all of the plurality of supply voltages.

5. The power management circuit of claim 3, wherein the voltage selection circuit in each of the plurality of ET voltage circuits is further configured to determine the selected supply voltage among a subset of the plurality of supply voltages.

6. The power management circuit of claim 1, wherein the at least one distributed ET voltage circuit comprises:
a distributed voltage amplifier configured to generate a distributed initial ET voltage based on a selected distributed supply voltage among the plurality of distributed supply voltages; and
a distributed offset capacitor configured to raise the distributed initial ET voltage by a distributed offset voltage to generate the at least one distributed ET voltage.

7. The power management circuit of claim 6, wherein the at least one distributed ET voltage circuit further comprises a distributed voltage selection circuit coupled to the distributed voltage amplifier and is configured to determine the selected distributed supply voltage among the plurality of distributed supply voltages based on the at least one distributed target voltage.

8. The power management circuit of claim 7, where the distributed voltage selection circuit is further configured to determine the selected distributed supply voltage among all of the plurality of distributed supply voltages.

9. The power management circuit of claim 7, wherein the distributed voltage selection circuit is further configured to determine the selected distributed supply voltage among a subset of the plurality of distributed supply voltages.

10. The power management circuit of claim 1, wherein the plurality of supply voltages comprises:
a high supply voltage ($VSUP_H$);
a first medium supply voltage ($VSUP_{M1}$) expressed as $[(1-x)/(1+x)]*VSUP_H$;
a second medium supply voltage ($VSUP_{M2}$) expressed as $[x/(1+x)]*VSUP_H$; and
a low supply voltage ($VSUP_L$) expressed as $[1/(1+x)]*VSUP_H$;
wherein x represents a scaling factor.

11. The power management circuit of claim 10, wherein the distributed supply voltage circuit is further configured to generate the plurality of distributed supply voltages based on the low supply voltage ($VSUP_L$).

12. The power management circuit of claim 11, wherein the plurality of distributed supply voltages comprises:
a distributed high supply voltage ($DVSUP_H$) expressed as $VSUP_L*(1+y)$;
a first distributed medium supply voltage ($DVSUP_{M1}$) expressed as $VSUP_L*(1-y)$;
a second distributed medium supply voltage ($DVSUP_{M2}$) expressed as $VSUP_L*y$; and
a distributed low supply voltage ($DVSUP_L$) that equals $VSUP_L$;
wherein y represents a distributed scaling factor.

13. The power management circuit of claim 12, wherein the distributed scaling factor is equal to the scaling factor.

14. The power management circuit of claim 12, wherein the distributed scaling factor is different from the scaling factor.

15. The power management circuit of claim 1, wherein the selected supply voltage among the plurality of supply voltages corresponds to a lowest one of the plurality of supply voltages.

16. The power management circuit of claim 15, wherein the plurality of distributed supply voltages comprises:

a distributed high supply voltage ($DVSUP_H$) expressed as $VSUP_L*(1+y)$;

a first distributed medium supply voltage ($DVSUP_{M1}$) expressed as $VSUP_L*(1-y)$;

a second distributed medium supply voltage ($DVSUP_{M2}$) expressed as $VSUP_L*y$; and a distributed low supply voltage ($DVSUP_L$) that equals $VSUP_L$;

wherein y represents a distributed scaling factor.

\* \* \* \* \*